United States Patent
Choi

(10) Patent No.: US 12,538,666 B2
(45) Date of Patent: Jan. 27, 2026

(54) DISPLAY APPARATUS AND METHOD OF MANUFACTURING THE SAME

(71) Applicant: Samsung Display Co., Ltd., Yongin-si (KR)

(72) Inventor: Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 539 days.

(21) Appl. No.: 17/977,805

(22) Filed: Oct. 31, 2022

(65) Prior Publication Data

US 2023/0269972 A1 Aug. 24, 2023

(30) Foreign Application Priority Data

Feb. 24, 2022 (KR) .......................... 10-2022-0024569

(51) Int. Cl.
*H10K 59/127* (2023.01)
*H10K 59/124* (2023.01)
*H10K 71/00* (2023.01)
*H10K 59/12* (2023.01)

(52) U.S. Cl.
CPC ........... *H10K 59/124* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 10,403,649 B2 | 9/2019 | Jeong et al. | |
| 10,868,096 B2 | 12/2020 | Park et al. | |
| 11,222,938 B2 | 1/2022 | Kim et al. | |
| 2012/0104397 A1 | 5/2012 | Choi et al. | |
| 2018/0366493 A1* | 12/2018 | Jeong | H10D 86/441 |
| 2019/0278145 A1 | 9/2019 | Tanaka et al. | |
| 2019/0317631 A1* | 10/2019 | Feng | G06F 3/044 |
| 2020/0117063 A1* | 4/2020 | Sugimoto | H10D 86/481 |

(Continued)

FOREIGN PATENT DOCUMENTS

| | | |
|---|---|---|
| CN | 110211992 A | 9/2019 |
| CN | 113272989 A | 8/2021 |

(Continued)

OTHER PUBLICATIONS

Ren et al., "First principles study of stability, mechanical, and electronic properties of chromium silicides," Chin. Phys. B, vol. 27, No. 10, 11 pages, 2018.

(Continued)

*Primary Examiner* — Nilufa Rahim
(74) *Attorney, Agent, or Firm* — Womble Bond Dickinson (US) LLP

(57) ABSTRACT

A display apparatus includes a substrate including a first pixel area and a second pixel area adjacent to each other, a semiconductor layer including a first semiconductor layer in the first pixel area, a second semiconductor layer in the second pixel area, and a bridge connecting the first semiconductor layer to the second semiconductor layer, and a first insulating layer on the semiconductor layer and having a first groove or a first opening corresponding to a boundary between the first pixel area and the second pixel area. The bridge includes a silicide material.

20 Claims, 30 Drawing Sheets

(56) References Cited

U.S. PATENT DOCUMENTS

2022/0093705 A1    3/2022  Kim et al.
2022/0123093 A1    4/2022  Kim et al.

FOREIGN PATENT DOCUMENTS

| KR | 10-2018-0137641 A | 12/2018 |
| KR | 10-2020-0076278 A | 6/2020 |
| KR | 10-2020-0088953 A | 7/2020 |
| KR | 2020-0113055 A | 10/2020 |

OTHER PUBLICATIONS

Nikanorov et al., "Structural and mechanical properties of Al-Si alloys obtained by fast cooling of a levitated melt," Materials Science and Engineering A, vol. 390, pp. 63-69, 2005.

\* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2022-0024569, filed on Feb. 24, 2022, in the Korean Intellectual Property Office, the entire content of which is incorporated by reference herein.

BACKGROUND

1. Field

One or more embodiments relate to display apparatuses and methods of manufacturing the same.

2. Description of the Related Art

Generally, in display apparatuses such as organic light-emitting display apparatuses, thin-film transistors are arranged in each (sub)pixel to control the luminance and/or other attributes of each (sub)pixel. The thin-film transistors control the luminance and/or other attributes of a corresponding (sub)pixel according to a received data signal and/or one or more signals.

SUMMARY

In the related art, such a display apparatus may become defective when subjected to an external impact, and it is not easy to display a high-resolution image in such instances.

Aspects of one or more embodiments relate to a display apparatus capable of displaying a high-resolution image while having a low defect rate when subjected to external impacts, and a method of manufacturing the display apparatus.

Aspects of one or more embodiments of the present disclosure are directed toward a display apparatus capable of displaying a high-resolution image while having a low defect rate when subjected to an external impact, and a method of manufacturing the display apparatus. However, aspects of embodiments according to the present disclosure are not limited thereto, and the above characteristics do not limit the scope of embodiments according to the present disclosure.

Additional aspects will be set forth in part in the description that follows and, in part, will be apparent from the description, or may be learned by practice of the presented embodiments of the disclosure.

According to one or more embodiments of the present disclosure, a display apparatus includes a substrate including a first pixel area and a second pixel area adjacent to each other, a semiconductor layer including a first semiconductor layer in the first pixel area, a second semiconductor layer in the second pixel area, and a bridge connecting the first semiconductor layer to the second semiconductor layer, and a first insulating layer on the semiconductor layer and having a first groove or first opening corresponding to a boundary between the first pixel area and the second pixel area. The bridge includes a silicide material.

In one or more embodiments, the first semiconductor layer, the second semiconductor layer, and the bridge may be integrated with one another.

In one or more embodiments, the bridge may pass through the first groove or the first opening.

In one or more embodiments, the first insulating layer may have a first contact hole exposing a partial area of the bridge in a direction toward the first semiconductor layer, and a second contact hole exposing a partial area of the bridge in a direction toward the second semiconductor layer.

In one or more embodiments, the display apparatus may further include a second insulating layer covering the semiconductor layer, and a conductive layer on the second insulating layer and including a shield layer overlapping the bridge when viewed in a direction perpendicular to the substrate.

In one or more embodiments, the second insulating layer may include a second groove or a second opening overlapping the first groove or the first opening when viewed in the direction perpendicular to the substrate, a third contact hole overlapping the first contact hole, a fourth contact hole overlapping the second contact hole, and may include an insulation bridge overlapping the shield layer.

In one or more embodiments, the conductive layer may include driving gate electrodes in the first pixel area and the second pixel area, respectively.

In one or more embodiments, the conductive layer may include compensation gate electrodes in the first pixel area and the second pixel area, respectively.

In one or more embodiments, the display apparatus may further include a metal pattern in contact with an upper surface of the bridge.

In one or more embodiments, the display apparatus may further include a passivation layer on the metal pattern and having a third opening overlapping the first groove or the first opening.

In one or more embodiments, a width of the shield layer in a direction perpendicular to an imaginary line connecting a center of the first pixel area to a center of the second pixel area may be greater than a width of the bridge in the direction perpendicular to the imaginary line.

In one or more embodiments, the silicide material may include at least element from among aluminum (Al), titanium (Ti), nickel (Ni), copper (Cu), chromium (Cr), tungsten (W), molybdenum (Mo), or tantalum (Ta).

In one or more embodiments, the bridge may include a first bridge and a second bridge, and the first bridge and the second bridge may be parallel to each other.

In one or more embodiments, the bridge may include a first bridge and a second bridge. The first bridge may extend in a direction parallel to an imaginary line connecting a center of the first pixel area to a center of the second pixel area, and the second bridge may extend in a direction perpendicular to the imaginary line.

In one or more embodiments, the bridge may include a plurality of through holes.

According to one or more embodiments of the present disclosure, a method of manufacturing a display apparatus includes forming a semiconductor layer on a substrate, the semiconductor layer including a first semiconductor layer in a first pixel area, a second semiconductor layer in a second pixel area, and a bridge connecting the first semiconductor layer to the second semiconductor layer, forming a first insulating layer on the semiconductor layer, forming a contact hole exposing a partial area of the bridge at the first insulating layer, forming a metal pattern in correspondence with the contact hole; siliciding the bridge, and forming a first groove or a first opening corresponding to a boundary between the first pixel area and the second pixel area at the first insulating layer.

In one or more embodiments, in the forming of the contact hole, the contact hole may be formed on a center of the bridge.

In one or more embodiments, in the forming of the contact hole, the contact hole may include a first contact hole and a second contact hole, the first contact hole may be formed to expose a partial area of the bridge in a direction toward the first semiconductor layer, and the second contact hole may be formed to expose a partial area of the bridge in a direction toward the second semiconductor layer.

In one or more embodiments, the method may further include forming a second insulating layer on the semiconductor layer after the forming of the semiconductor layer and before the forming of the first insulating layer, and forming the conductive layer on the second insulating layer, the conductive layer including a shield layer overlapping the bridge when viewed in a direction perpendicular to the substrate.

In one or more embodiments, the method may further include forming a passivation layer on the metal pattern, between the forming of the metal pattern and the siliciding of the bridge. In the forming of the first groove or the first opening, a third opening overlapping the first groove or the first opening may be formed at the passivation layer.

These and/or other aspects will become apparent and more readily appreciated from the following description of the embodiments, taken in conjunction with the accompanying drawings.

BRIEF DESCRIPTION OF THE DRAWINGS

The above and other aspects, features, and/or principles of one or more embodiments of the present disclosure will be more apparent from the following description taken in conjunction with the accompanying drawings, in which.

DETAILED DESCRIPTION

Figure 1:
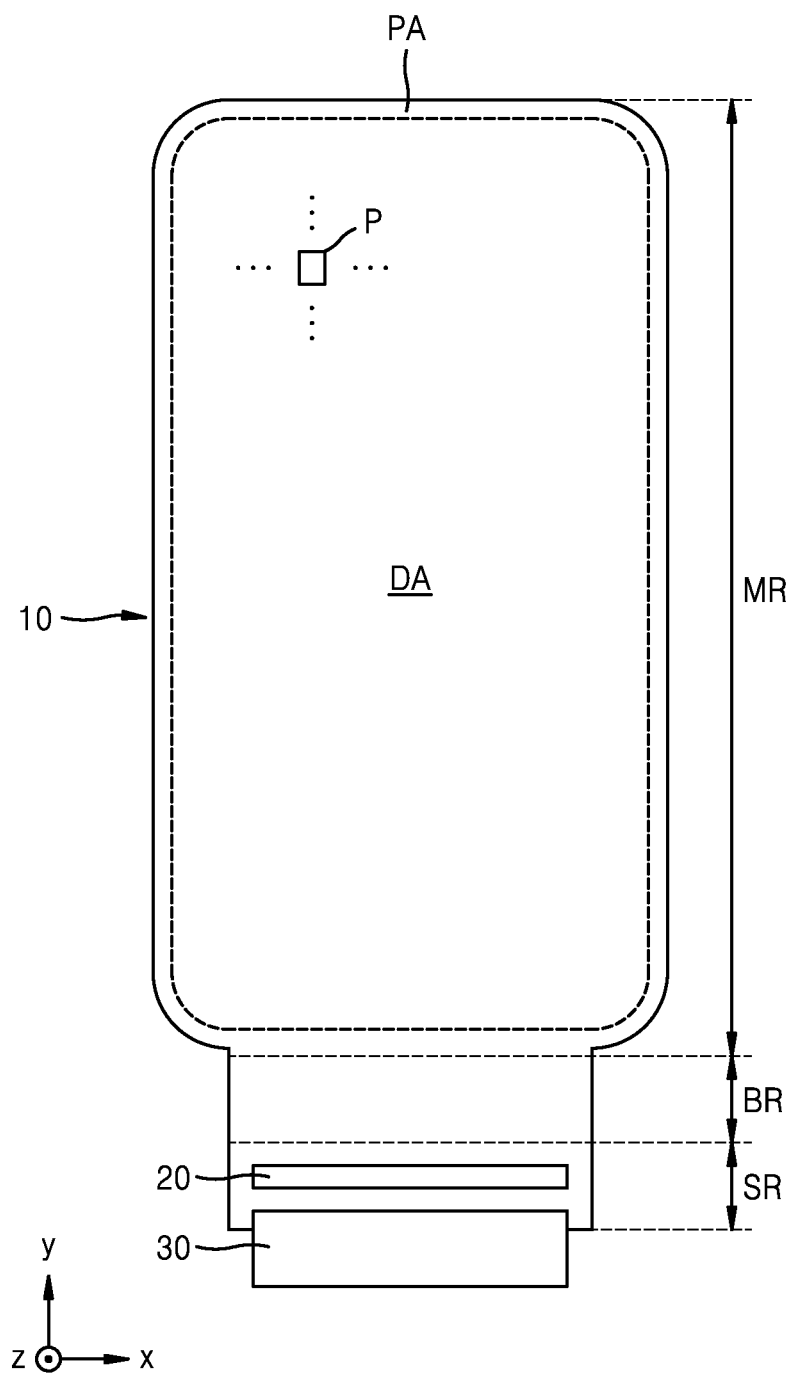
FIG. 1 is a schematic plan view of a portion of a display apparatus according to one or more embodiments of the present disclosure.

References will now be made in detail to embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. These embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Expressions such as "at least one of," "a plurality of," "one of," and other prepositional phrases, when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As the disclosure allows for various changes and numerous embodiments, one or more embodiments will be illustrated in the drawings and described in detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

One or more embodiments of the disclosure will be described below in more detail with reference to the accompanying drawings. Those components that are the same as or are in correspondence with each other are rendered the same reference numeral regardless of the figure number, and redundant explanations may be omitted.

It will be understood that, unless otherwise specified, when an element such as a layer, film, region or substrate is referred to as being "on" another element, it can be "directly" on the other element or intervening elements may also be present. In the drawings, the thicknesses of layers and regions may be exaggerated or minimized for convenience of explanation. For example, because sizes and thicknesses of components in the drawings are illustrated for convenience of explanation, embodiments of the disclosure are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises," "comprising," "includes," and "including" used herein specify the presence of stated features or components, but do not preclude the presence or addition of one or more other features or components.

In the present specification, "A and/or B" represents A or B, or A and B. The expression "at least one of A and B" indicates only A, only B, both A and B, or variations thereof.

It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
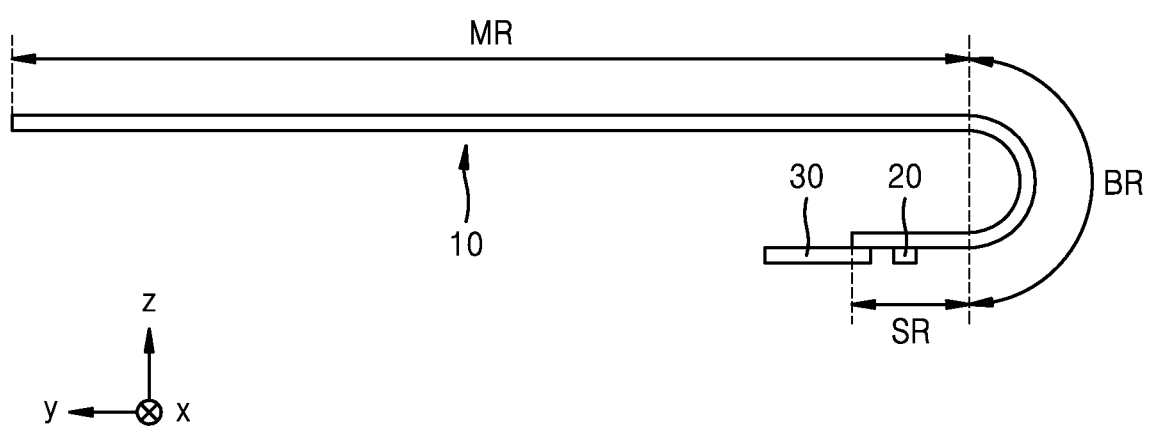
FIG. 2 is a schematic side view of the display apparatus of FIG. 1, according to one or more embodiments of the present disclosure.

FIG. 1 is a plan view schematically illustrating a portion of a display apparatus according to one or more embodiments of the present disclosure, and FIG. 2 is a side view schematically illustrating the display apparatus of FIG. 1, according to one or more embodiments of the present disclosure. A plan view, as used in the present specification, may correspond to a view in which the device or a portion of the device is viewed in a z direction. A portion of the display apparatus according to the present embodiment(s) is bent as in FIG. 2. However, FIG. 1 illustrates the display apparatus in an unbent state, for convenience of explanation.

As illustrated in FIGS. 1 and 2, the display apparatus according to one or more embodiments includes a display panel 10. The display apparatus may be of any type as long as it includes the display panel 10. For example, the display apparatus may be any one of various products, such as a smartphone, a tablet, a laptop, a television, or a billboard.

The display panel 10 includes a display area DA and a peripheral area PA around the display area DA. The display area DA may be an area for displaying an image, and a plurality of pixels may be arranged in the display area DA. When viewed in a direction approximately perpendicular to the display apparatus 10, the display area DA may have any of various shapes such as a circular shape, an oval shape, a polygonal shape, and/or any other suitable shape. FIG. 1 illustrates one or more embodiments where the display area DA has a substantially rectangular shape with rounded corners. The peripheral area PA may be located outside the display area DA.

Figure 18A:
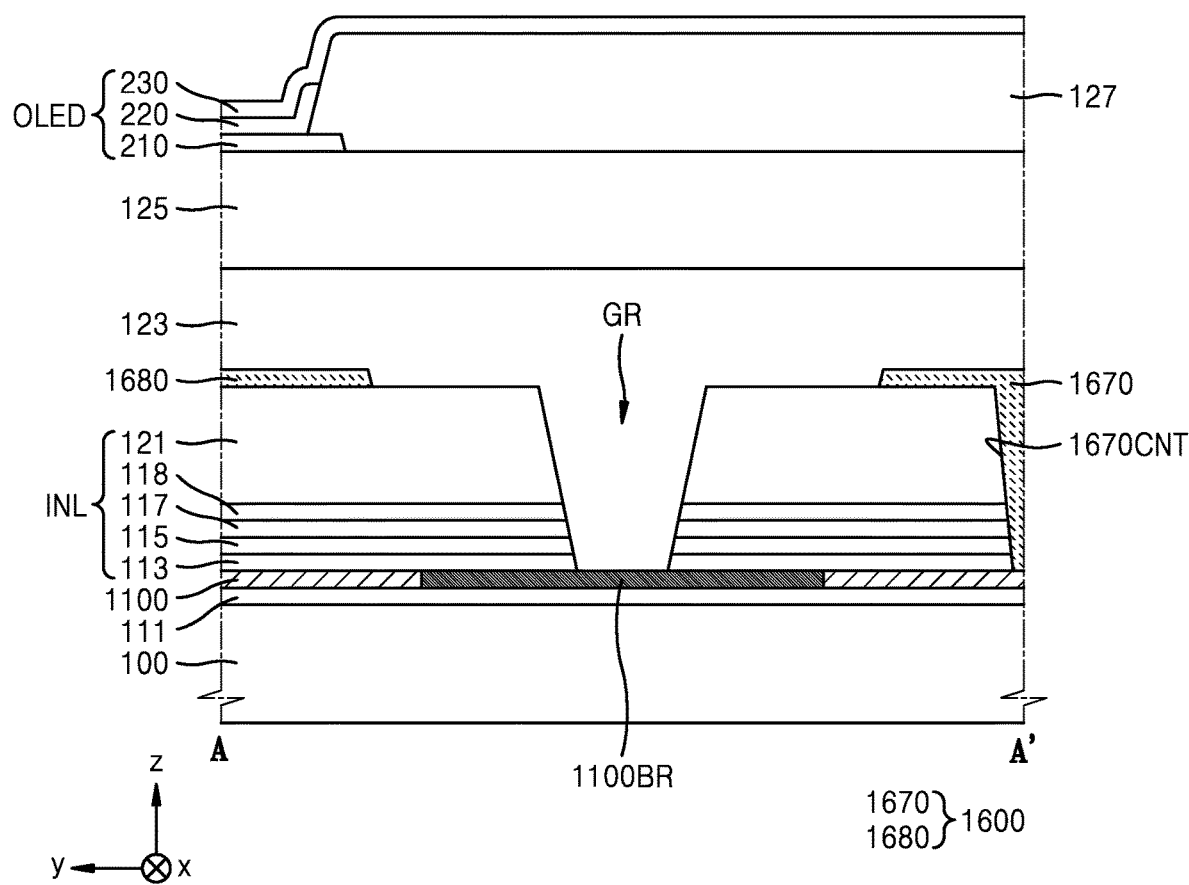
FIGS. 18A and 18B are schematic cross-sectional views taken along the line A-A' of FIG. 4, according to one or more embodiments of the present disclosure.

Because the display panel 10 includes a substrate 100 of FIG. 18A, it may be considered that the substrate 100 includes the display area DA and the peripheral area PA. Various components included in the display panel 10 may be located over the substrate 100. The substrate 100 may include glass, a metal, and/or a polymer resin. When the display panel 10 is bent in a bending region BR as described in more detail below, the substrate 100 needs to be flexible or bendable. In this case, the first substrate 100 may include polymer resin such as polyethersulphone, polyacrylate, polyetherimide, polyethylene naphthalate, polyethylene terephthalate, polyphenylene sulfide, polyarylate, polyimide, polycarbonate, and/or cellulose acetate propionate. The substrate 100 may have a multi-layered structure including two layers, including a polymer resin and a barrier layer including an inorganic material (e.g., silicon oxide, silicon nitride, silicon oxynitride, and/or other suitable material(s)) located between the two layers. In this way, various modifications may be made.

A plurality of pixels P are located in the display area DA. Each of the plurality of pixels P may be referred to as a subpixel and may be included in a display device such as an organic light-emitting diode OLED. The pixel P may emit, for example, red light, green light, blue light, or white light.

The display panel 10 may include a main region MR, a bending region BR outside the main region MR, and a subregion SR located opposite the main region MR with respect to the bending region BR. As illustrated in FIG. 2, the display panel 10 may be bent in the bending region BR such that at least a portion of the subregion SR may overlap the main region MR in a view in a z-axis direction. However, the disclosure is not limited to a bent display apparatus and may also be applied to an unbent display apparatus. The subregion SR may be a non-display area as described in more detail below. By allowing the display panel 10 to be bent in the bending region BR, the non-display area may not be viewed when the display apparatus is viewed from the front (e.g., in a −z direction or a plan view) or the size of viewed area of the non-display area may be minimized (or reduced) even when it is viewed.

A driving chip 20 may be arranged in the subregion SR of the display panel 10. The driving chip 20 may include an integrated circuit for driving the display panel 10. The integrated circuit may be a data driving integrated circuit for generating a data signal; however, the present disclosure is not limited thereto.

The driving chip 20 may be mounted in the subregion SR of the display panel 10. The driving chip 20 may be mounted on the same surface as the display surface of the display area DA; however, as the display panel 10 is bent in the bending region BR as described above, the driving chip 20 may be located on a rear surface of the main region MR.

A printed circuit board 30 and/or other suitable circuitry may be attached to an end of the subregion SR of the display panel 10. The printed circuit board 30 and/or other suitable circuitry may be electrically connected to the driving chip 20 and/or other suitable circuitry through a pad on a substrate.

An organic light-emitting display apparatus will now be illustrated and described as a display apparatus according to one or more embodiments of the present disclosure, but a display apparatus of the present disclosure is not limited thereto. According to one or more embodiments, the display apparatus of the present disclosure may be an inorganic light-emitting display, a quantum dot light-emitting display, and/or any other suitable display. For example, an emission layer of a display device included in the display apparatus may include an organic material or may include an inorganic material. The display apparatus may include an emission layer and quantum dots located in the path of light emitted by the emission layer.

Figure 3:
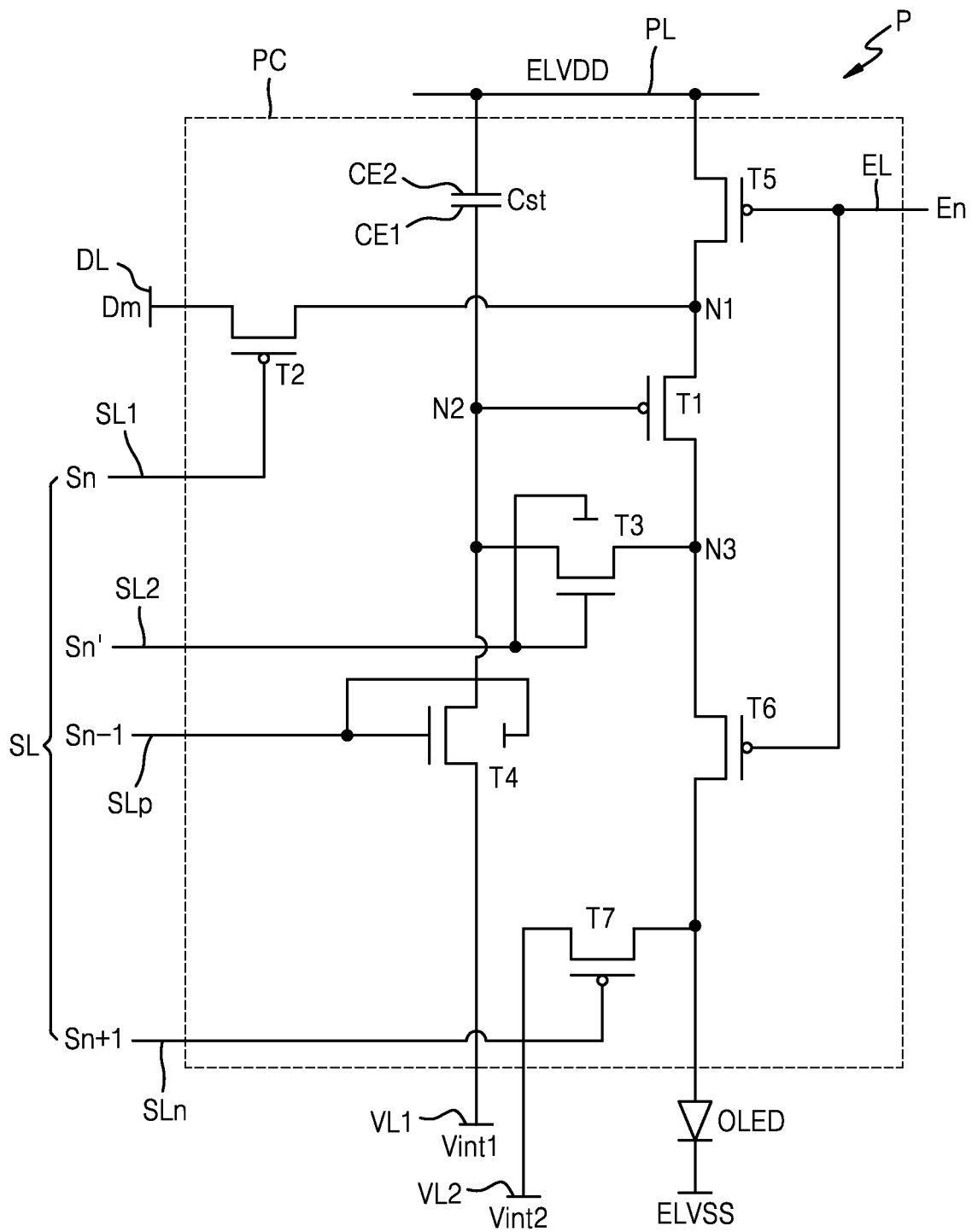
FIG. 3 is an equivalent circuit diagram of a pixel included in the display apparatus of FIG. 1, according to one or more embodiments of the present disclosure.

FIG. 3 is an equivalent circuit diagram of a pixel included in the display apparatus of FIG. 1, according to one or more embodiments of the present disclosure. As illustrated in FIG. 3, a pixel P may include a pixel circuit PC, and an organic light-emitting diode OLED electrically connected to the pixel circuit PC.

As illustrated in FIG. 3, the pixel circuit PC may include a plurality of thin-film transistors T1 through T7 and a storage capacitor Cst. The plurality of thin-film transistors T1 through T7 and the storage capacitor Cst may be connected to signal lines SL1, SL2, SLp, SLn, EL, and DL, a first initializing voltage line VL1, a second initializing voltage line VL2, and a first power supply voltage line PL. At least one of these lines, for example, the first power supply voltage line PL, may be shared by adjacent pixels P.

The plurality of thin-film transistors T1 through T7 may include a driving transistor T1, a writing transistor T2, a compensating transistor T3, a first initializing transistor T4, an operation control transistor T5, a light-emission control transistor T6, and a second initializing transistor T7.

The organic light emitting diode OLED may include a pixel electrode and an opposite electrode, the pixel electrode of the organic light emitting diode OLED may be connected to the driving transistor T1 via the emission control transistor T6 to receive a driving current, and the opposite electrode may receive a second power supply voltage ELVSS. The organic light-emitting diode OLED may generate light having a brightness corresponding to the driving current.

Some of the plurality of thin-film transistors T1 through T7 may be n-channel metal oxide semiconductor (NMOS) transistors, e.g., NMOS field effect transistors (N-MOSFETs), and the others may be p-channel metal oxide semiconductor (PMOS) transistors, e.g., PMOS field effect transistors (P-MOSFETs). For example, among the plurality of thin-film transistors T1 through T7, the compensating transistor T3 and the first initializing transistor T4 may be NMOS transistors (e.g., N-MOSFETs) and the others may be PMOS transistors (e.g., P-MOSFETs). In one or more embodiments, among the plurality of thin-film transistors T1 through T7, the compensating transistor T3, the first initializing transistor T4, and the second initializing transistor T7 may be NMOS transistors (e.g., N-MOSFETs) and the others may be PMOS transistors (e.g., P-MOSFETs). In one or more embodiments, all of the thin-film transistors T1 through T7 may be NMOS transistors or PMOS transistors. The plurality of thin-film transistors T1 through T7 may include amorphous silicon and/or polysilicon. In one or more embodiments, an NMOS thin-film transistor may include an oxide semiconductor. Hereinafter, for convenience of description, a case in which the compensating transistor T3 and the first initializing transistor T4 are NMOS transistors including an oxide semiconductor and the others are PMOS transistors will be described.

The signal lines SL1, SL2, SLp, SLn, EL, and DL may include a first scan line SL1 configured to transmit a first scan signal Sn, a second scan line SL2 configured to transmit a second scan signal Sn', a previous scan line SLp configured to transmit a previous scan signal Sn−1 to the first initializing transistor T4, a next scan line SLn configured to transmit a next scan signal Sn+1 to the second initializing transistor T7, a light-emission control line EL configured to transmit a light-emission control signal En to the operation control transistor T5 and the light-emission control transistor T6, and a data line DL intersecting with the first scan line SL1 and configured to transmit a data signal Dm.

The first power supply voltage line PL may be configured to transmit a first power supply voltage ELVDD to the driving transistor T1, the first initializing voltage line VL1 may be configured to transmit a first initializing voltage Vint1 for initializing the driving transistor T1, and the second initializing voltage line VL2 may be configured to transmit a second initializing voltage Vint2 for initializing a pixel electrode of the organic light emitting diode OLED.

A driving gate electrode of the driving transistor T1 may be connected to the storage capacitor Cst through a second node N2, and the source region or the drain region of the driving transistor T1 may be connected to the first power supply voltage line PL through a first node N1 via the operation control transistor T5, and the other of the source region and the drain region of the driving transistor T1 may be electrically connected to the pixel electrode of the organic light-emitting diode OLED through a third node N3 via the emission control transistor T6. The driving transistor T1 may receive the data signal Dm according to an operation of the writing transistor T2 to supply the driving current to the organic light-emitting diode OLED.

A switching gate electrode of the writing transistor T2 may be connected to the first scan line SL1 configured to transmit the first scan signal Sn, the source region or the drain region of the writing transistor T2 may be connected to the data line DL, and the other of the source region and the drain region of the writing transistor T2 may be connected to the driving transistor T1 through the first node N1 and also connected to the first power supply voltage line PL via the operation control transistor T5. The writing transistor T2 may be turned on in response to the first scan signal Sn received through the first scan line SL, to perform an operation of transmitting the data signal Dm received from the data line DL, through the first node N1 to the driving transistor T1.

A compensating gate electrode of the compensating transistor T3 is connected to the second scan line SL2. The source region or the drain region of the compensating transistor T3 may be connected to the pixel electrode of the organic light-emitting diode OLED through the third node N3 via the emission control transistor T6. The other of the source region and the drain region of the compensating transistor T3 may be connected to a first capacitor electrode CE1 of the storage capacitor Cst and the driving gate electrode of the driving transistor T1 through the second node N2. The compensating transistor T3 may be turned on in response to the second scan signal Sn' received through the second scan line SL2, to diode-connect the driving transistor T1.

A first initializing gate electrode of the first initializing transistor T4 may be connected to the previous scan line SLp. The source region or the drain region of the first initializing transistor T4 may be connected to the first initializing voltage line VL1. The other of the source region and the drain region of the first initializing transistor T4 may be connected to the first capacitor electrode CE1 of the storage capacitor Cst and the driving gate electrode of the driving transistor T1 through the second node N2. The first initializing transistor T4 may be turned on in response to the previous scan signal Sn−1 received through the previous scan line SLp, to perform an initialization operation of initializing the voltage of the driving gate electrode of the driving transistor T1 by transmitting the first initializing voltage Vint1 to the driving gate electrode of the driving transistor T1.

An operation control gate electrode of the operation control transistor T5 may be connected to the emission control line EL, the source region or the drain region of the operation control transistor T5 may be connected to the first power supply voltage line PL, and the other may be connected to the driving transistor T1 and the writing transistor T2 through the first node N1.

An emission control gate electrode of the emission control transistor T6 may be connected to the emission control line EL, the source region or the drain region of the emission control transistor T6 may be connected to the driving transistor T1 and the compensating transistor T3 through the third node N3, and the other of the source region and the drain region of the emission control transistor T6 may be electrically connected to the pixel electrode of the organic light-emitting diode OLED.

The operation control transistor T5 and the emission control transistor T6 may be simultaneously turned on in response to the emission control signal En received through the emission control line EL such that a driving current corresponding to a voltage difference between the first power supply voltage ELVDD and the voltage of the driving gate electrode of the driving transistor T1 may flow through the organic light-emitting diode OLED.

A second initialization gate electrode of the second initializing transistor T7 may be connected to the next scan line SLn, the source region or the drain region of the second initializing transistor T7 may be connected to the pixel electrode of the organic light-emitting diode OLED, and the other of the source region and the drain region of the second initialization transistor T7 may be connected to the second initializing voltage line VL2 to receive the second initializing voltage Vint2. The second initializing transistor T7 is turned on in response to the next scan signal Sn+1 received via the next scan line SLn to initialize the pixel electrode of the organic light-emitting device OLED. The next scan line SLn may be the same as the first scan line SL1. In this case, the scan line may function as the first scan line SL1 or as the next scan line SLn by transmitting the same electrical signal with a time difference. In other words, the next scan line SLn may be the first scan line of a pixel electrically connected to the data line DL, e.g., a pixel adjacent to the pixel P illustrated in FIG. 3.

The second initialization transistor T7 may be connected to the next scan line SLn as illustrated in FIG. 3. However, the present disclosure is not limited thereto, and in one or more embodiments, the second initializing transistor T7 may be connected to the emission control line EL to be driven according to the emission control signal En.

The storage capacitor Cst may include a first capacitor electrode CE1 and a second capacitor electrode CE2. The first capacitor electrode CE1 of the storage capacitor Cst may be connected to the driving gate electrode of the driving transistor T1 through the second node N2, and the second capacitor electrode CE2 of the storage capacitor Cst may be connected to the first power supply voltage line PL. The storage capacitor Cst may store the charge corresponding to the difference between the first power supply voltage ELVDD and the driving gate electrode voltage of the driving transistor T1.

A detailed operation of each pixel P according to one or more embodiments of the present disclosure will now be described.

During an initializing period, when the previous scan signal Sn−1 is supplied via the previous scan line SLp, the first transistor T4 is turned on in response to the previous scan signal Sn−1, and the driving transistor T1 is initialized by the first initializing voltage Vint supplied from the first initializing voltage line VL1.

During a data programming period, when the first scan signal Sn and the second scan signal Sn' are supplied through the first scan line SL1 and the second scan line SL2, the writing transistor T2 and the compensating transistor T3 may be turned on in response to the first scan signal Sn and the second scan signal Sn'. At this time, the driving transistor T1 is diode-connected by the turned-on compensating transistor T3 and is biased in a forward direction. Then, a compensating voltage Dm+Vth (where Vth has a negative value) obtained by subtracting a threshold voltage Vth of the driving transistor T1 from the data signal Dm supplied from the data line DL is applied to the driving gate electrode of the driving transistor T1. The first power supply voltage ELVDD and the compensating voltage Dm+Vth are applied to both ends of the storage capacitor Cst, and a charge corresponding to a voltage difference between both ends is stored in the storage capacitor Cst.

During a light emission period, the operation control transistor T5 and the emission control transistor T6 are turned on by the emission control signal En supplied from the emission control line EL. A driving current may be generated according to the voltage difference between the first power voltage ELVDD and the voltage of the driving gate electrode of the driving transistor T1, and the driving current may be supplied to the organic light-emitting diode OLED through the emission control transistor T6.

As described above, some of the plurality of thin-film transistors T1 through T7 may include an oxide semiconductor. For example, the compensating transistor T3 and the first initializing transistor T4 may include an oxide semiconductor.

Because polysilicon has high reliability, it may accurately control an intended current to flow. Thus, the driving transistor T1 directly affecting the brightness of the display apparatus includes a semiconductor layer including polysilicon having high reliability, and thus a high-resolution display apparatus may be realized. Because an oxide semiconductor has high carrier mobility and a low leakage current, a voltage drop is not big even when a driving time is long. In other words, in the case of an oxide semiconductor, low frequency driving is possible because a change in the color of an image due to a voltage drop is not big even during low frequency driving. Thus, the compensating transistor T3 and the first initializing transistor T4 may be configured to include an oxide semiconductor to implement a display apparatus having reduced power consumption while preventing (or substantially preventing) the occurrence of a leakage current.

However, because the oxide semiconductor may be sensitive to light, a change may occur in the current amount or the like due to external light. Thus, the external light may be absorbed or reflected by locating (or positioning) a metal layer under the oxide semiconductor. Accordingly, as illustrated in FIG. 3, in each of the compensating transistor T3 and the first initializing transistor T4 including an oxide semiconductor, a gate electrode may be located over and under an oxide semiconductor layer. In other words, in a view in a direction perpendicular to the upper surface of the substrate 100 (e.g., in the z-axis direction or a plan view), the metal layer located under the oxide semiconductor may overlap the oxide semiconductor.

Figure 4:
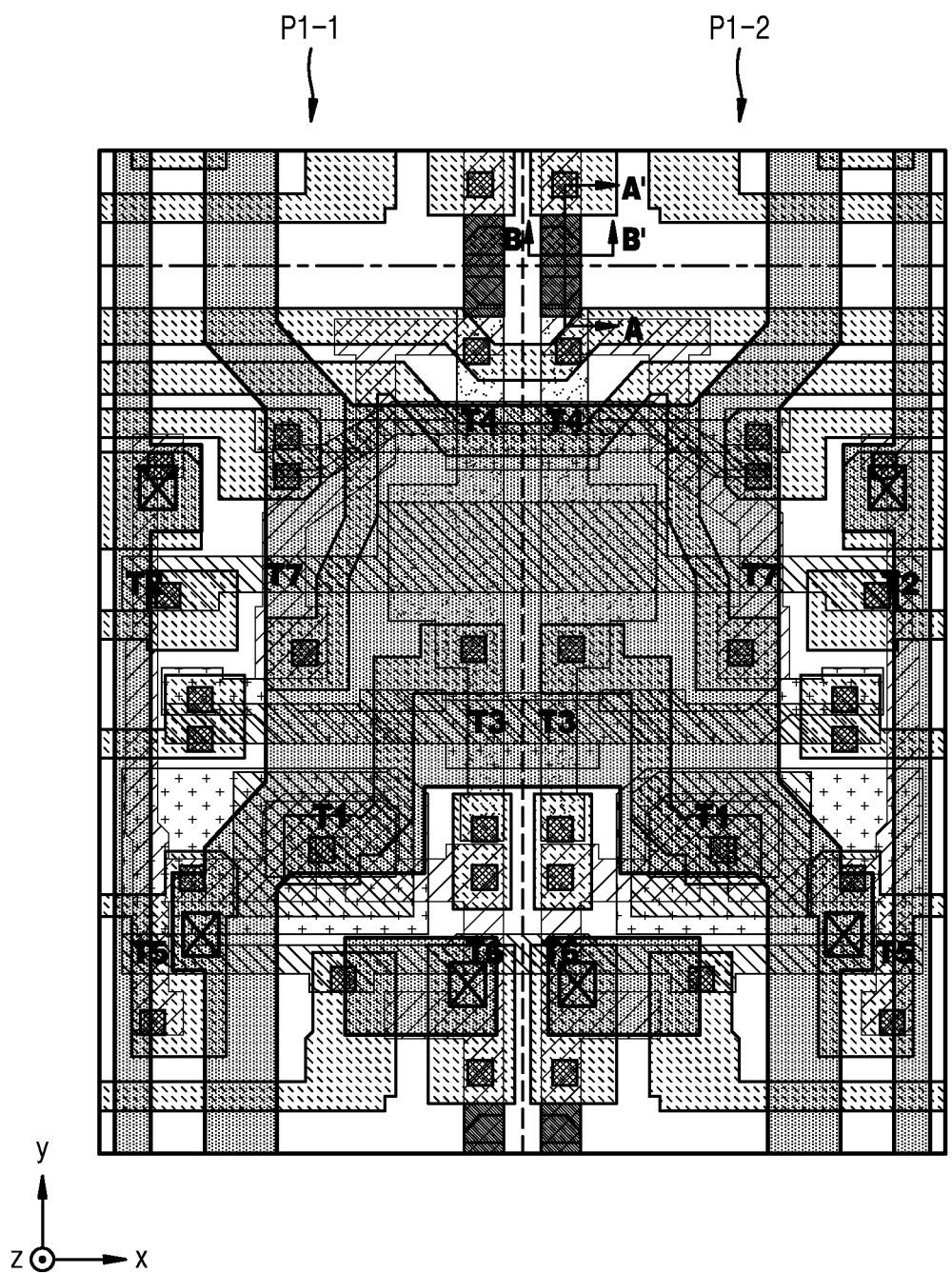
FIG. 4 is a plan view schematically illustrating an arrangement of components, such as transistors and capacitors, in pixels included in the display apparatus of FIG. 1, according to one or more embodiments of the present disclosure.

FIG. 4 is a plan view schematically illustrating an arrangement of components, such as transistors and capacitors, in pixels included in the display apparatus of FIG. 1, according to one or more embodiments of the present disclosure. FIGS. 5 to 11 are plan views schematically illustrating, on a layer-by-layer basis, components, such as transistors and capacitors, of the display apparatus illustrated in FIG. 4, according to one or more embodiments of the present disclosure.

As illustrated in the drawings (e.g., FIGS. 4 to 11), the display apparatus may include a first first pixel (hereinafter, a 1-$1^{st}$ pixel) P1-1 and a second first pixel (hereinafter, a 1-$2^{nd}$ pixel) P1-2 adjacent to each other. The 1-$1^{st}$ pixel P1-1 and the 1-$2^{nd}$ pixel P1-2 may be symmetrical with respect to an imaginary line, which is indicated by dotted line, as illustrated in FIG. 4 and FIGS. 5 to 11. In one or more embodiments, the 1-$1^{st}$ pixel P1-1 and the 1-$2^{nd}$ pixel P1-2 may have the same or substantially the same structure instead of having structures symmetrical to each other. The 1-$1^{st}$ pixel P1-1 may include a first first pixel circuit (hereinafter, a 1-$1^{st}$ pixel circuit), and the 1-$2^{nd}$ pixel P1-2 may include a second first pixel circuit (hereinafter, a 1-$2^{nd}$ pixel circuit). Hereinafter, for convenience of description, some conductive patterns will be described with reference to the 1-$1^{st}$ pixel circuit; however, these conductive patterns may also be symmetrically arranged in the 1-$2^{nd}$ pixel circuit.

Figure 5:
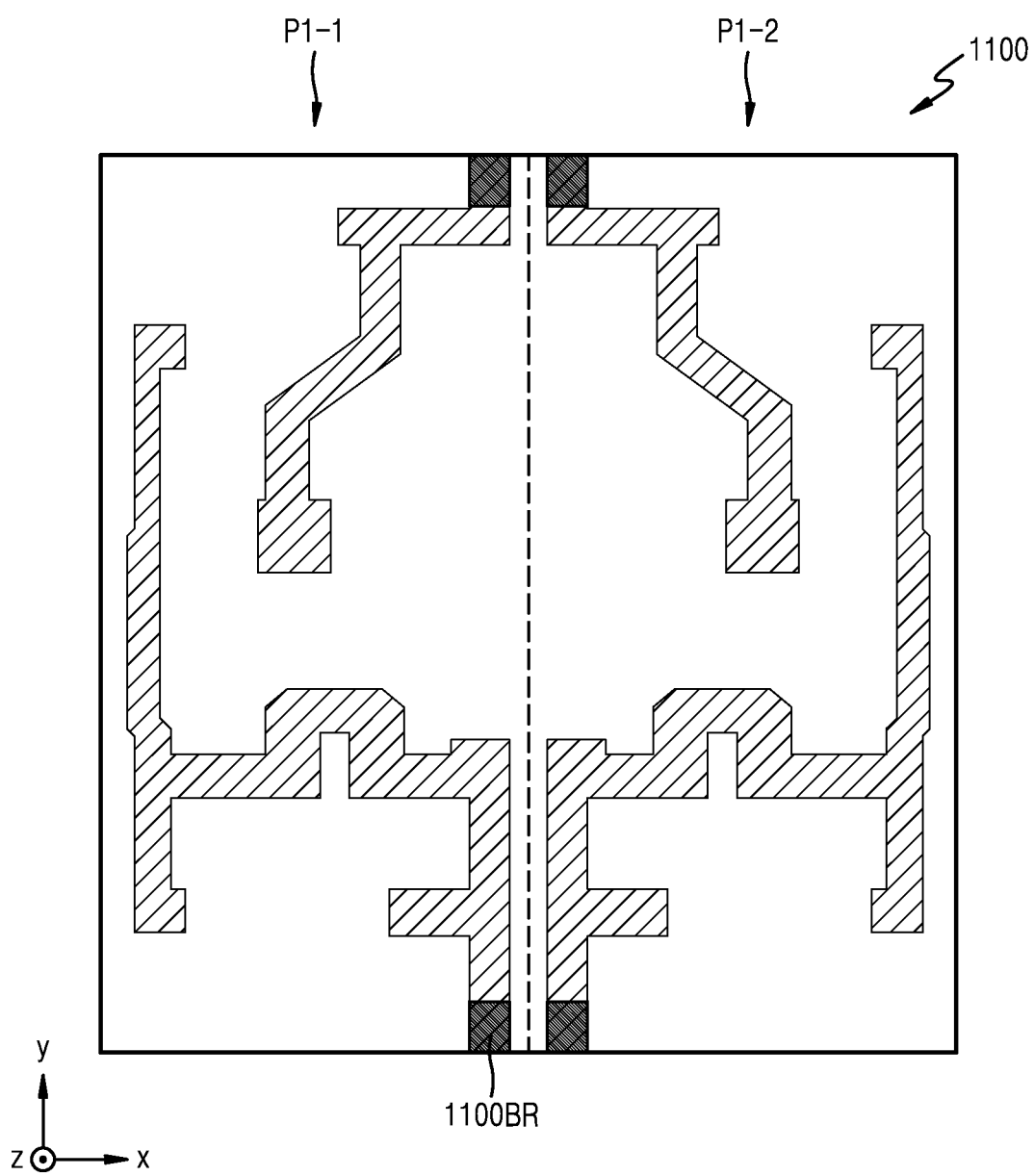
FIGS. 5 to 11 are plan views schematically illustrating, on a layer-by-layer basis, components, such as transistors and capacitors, of the display apparatus illustrated in FIG. 4, according to one or more embodiments of the present disclosure.

A first semiconductor layer 1100 shown in FIG. 5 may include a silicon semiconductor. For example, the first semiconductor layer 1100 may include amorphous silicon or polysilicon. In detail, the first semiconductor layer 1100 may include polysilicon crystallized at low temperature. In one or more embodiments, ions may be implanted into at least a portion of the first semiconductor layer 1100.

The first semiconductor layer 1100 may include a bridge 1100BR for electrically connecting pixel circuits adjacent to each other in a second direction (e.g., the y-axis direction). Unlike other components constituting the first semiconductor layer 1100, the bridge 1100BR may include a silicide material. For example, the bridge 1100BR may be polysilicon that is silicided to include at least one element from among aluminum (Al), titanium (Ti), nickel (Ni), copper (Cu), chromium (Cr), tungsten (W), molybdenum (Mo), or tantalum (Ta).

The driving transistor T1, the writing transistor T2, the operation control transistor T5, the emission control transistor T6, and the second initializing transistor T7 may be located along the first semiconductor layer 1100 as illustrated in FIG. 4. The driving transistor T1, the writing transistor T2, the operation control transistor T5, the emission control transistor T6, and the second initializing transistor T7 may be PMOS transistors as described above.

Figure 6A:
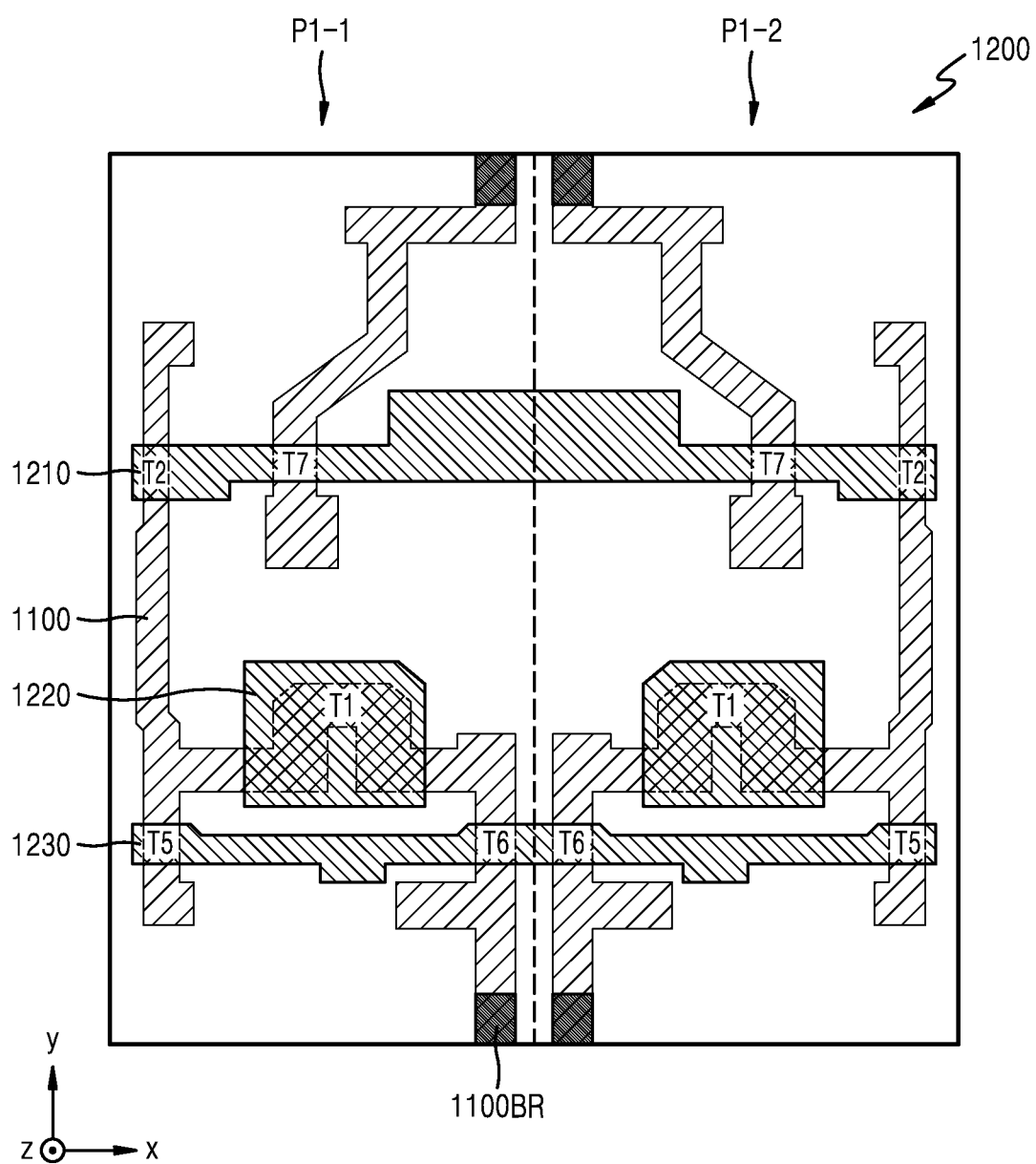
Figure 6B:
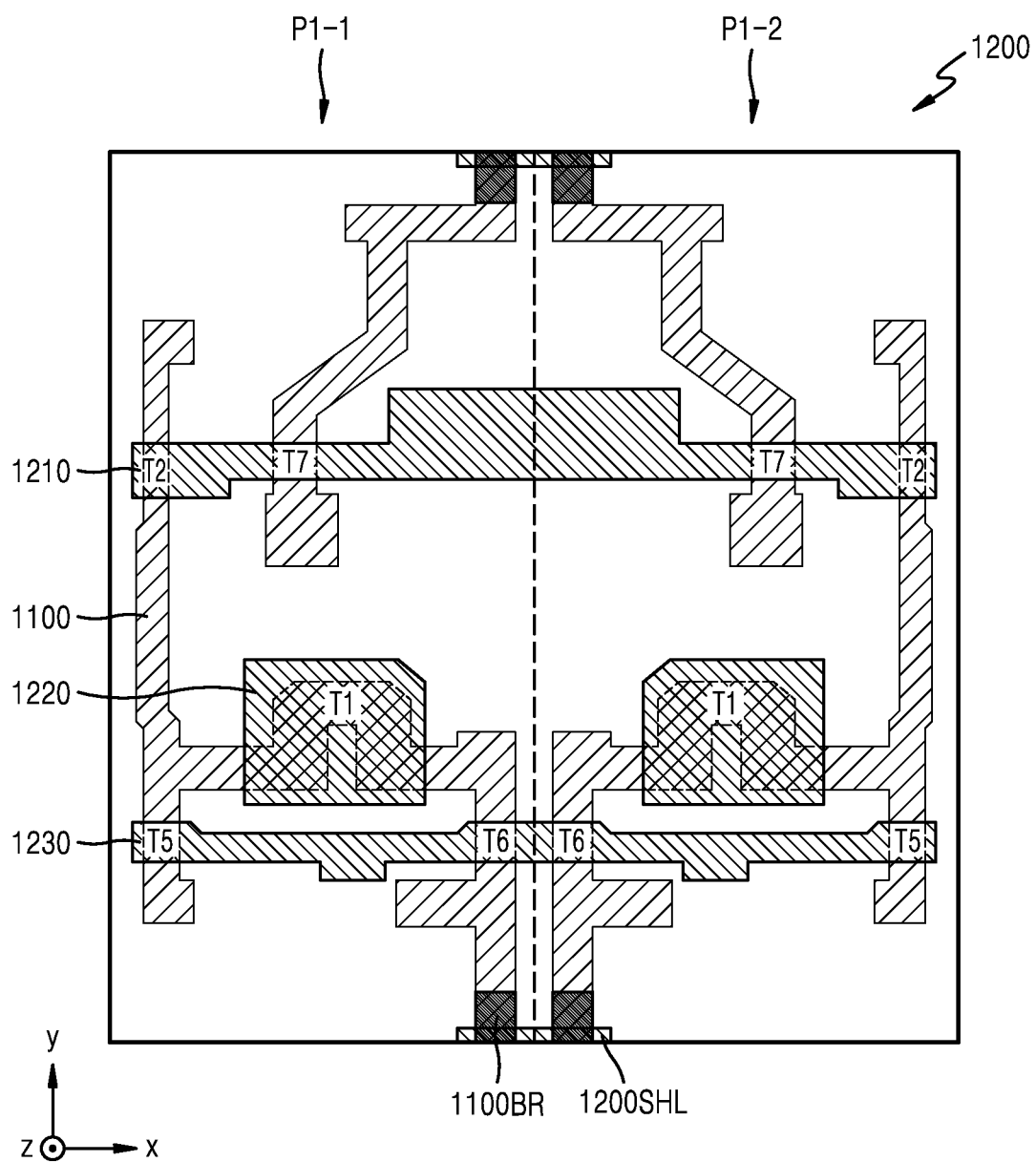

In FIGS. 6A and 6B, for convenience of illustration, a first conductive layer 1200 is illustrated together with the first semiconductor layer 1100. The first conductive layer 1200 may include a first gate line 1210, a first gate electrode 1220, and a second gate line 1230. The first gate line 1210 may extend in a first direction (e.g., an x-axis direction). The first gate line 1210 may be the first scan line SL1 or the next scan line SLn of FIG. 3. In other words, as for the 1-$1^{st}$ pixel P1-1 and the 1-$2^{nd}$ pixel P1-2 as illustrated in FIGS. 6A and 6B, the first gate line 1210 may correspond to the first scan line SL1 of FIG. 3, and as for pixels adjacent to the 1-$1^{st}$ pixel P1-1 and the 1-$2^{nd}$ pixel P1-2 (e.g., in the +y direction), the first gate line 1210 may correspond to the next scan line SLn of FIG. 3. Accordingly, the first scan signal Sn and the next scan signal Sn+1 may be applied to the pixels through the first gate line 1210. Portions of the first gate line 1210 overlapping the first semiconductor layer 1100 may be the switching gate electrode of the writing transistor T2 and the second initializing gate electrode of the second initialization transistor T7.

The first gate electrode 1220 may have an isolated shape. The first gate electrode 1220 is the driving gate electrode of the driving transistor T1.

The second gate line 1230 may extend in the first direction (e.g., the x-axis direction). The second gate line 1230 may correspond to the emission control line EL of FIG. 3. Portions of the second gate line 1230 overlapping the first semiconductor layer 1100 may be the operation control gate electrode of the operation control transistor T5 and the emission control gate electrode of the emission control transistor T6. The emission control signal En may be applied to the pixels through the second gate line 1230.

The first conductive layer 1200 may include a metal, an alloy, a conductive metal oxide, and/or a transparent conductive material. For example, the first conductive layer 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), and/or indium zinc oxide (IZO). The first conductive layer 1200 may have a multi-layered structure. For example, the first conductive layer 1200 may have a double-layer structure of Mo/Al or a three-layered structure of Mo/Al/Mo.

As shown in FIG. 6B, the first conductive layer 1200 may further include a first shield layer 1200SHL. For example, when viewed in a direction perpendicular to the upper surface of the substrate 100 (e.g., in the z-axis direction or a plan view), the first shield layer 1200SHL may be arranged to overlap the bridge 1100BR and a portion of a groove GR (see, e.g., FIG. 16) or opening of inorganic insulating layers INL as shown, for example, in FIG. 16. According to one or more embodiments, a width of the first shield layer 1200SHL in the first direction (e.g., the x-axis direction) may be greater than a width of the bridge 1100BR in the first direction (e.g., the x-axis direction). The first shield layer 1200SHL may serve to protect the layers therebelow from being damaged when the groove GR or the opening is formed by removing a portion of the inorganic insulating layers INL.

Figure 7A:
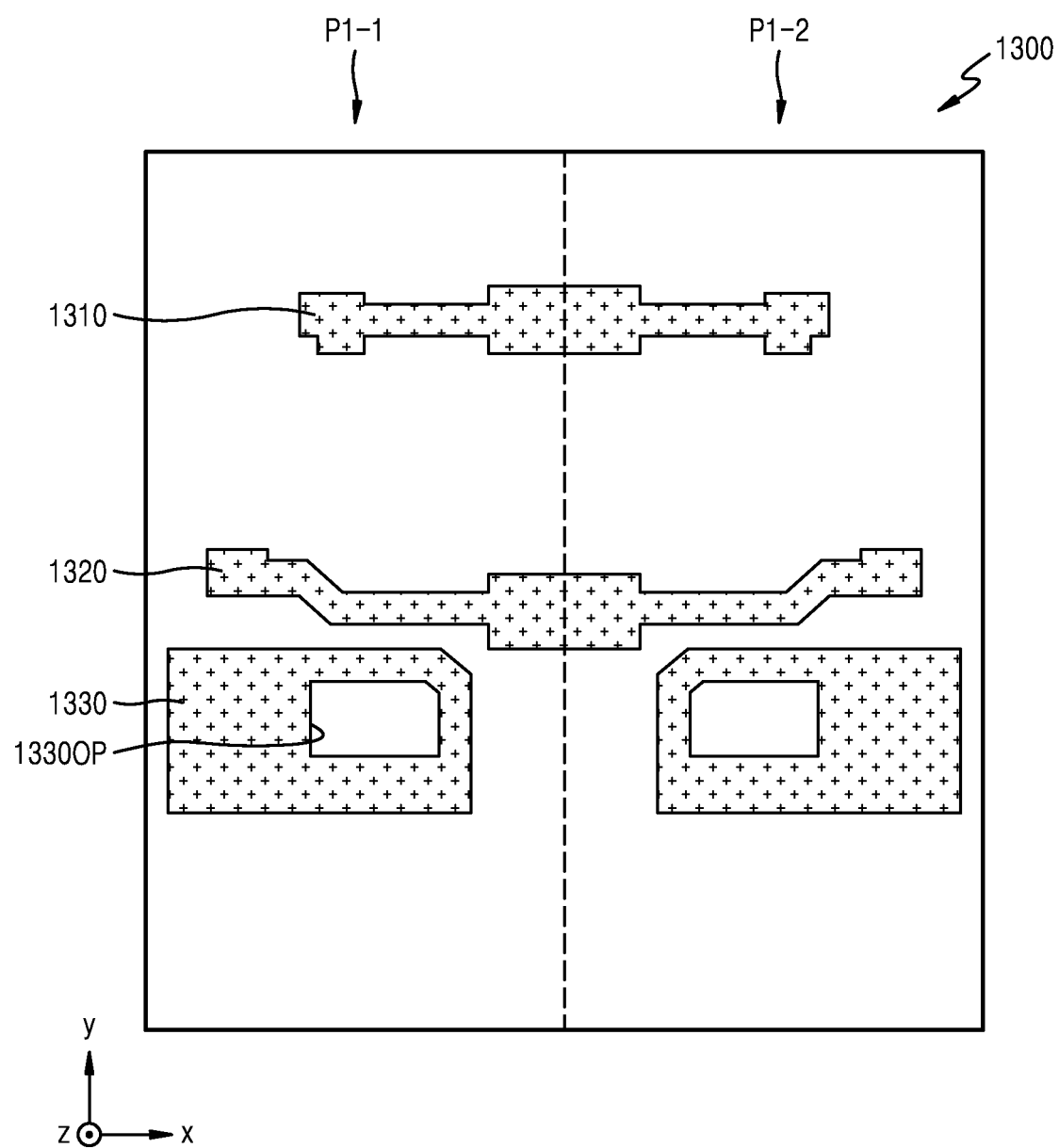
Figure 7B:
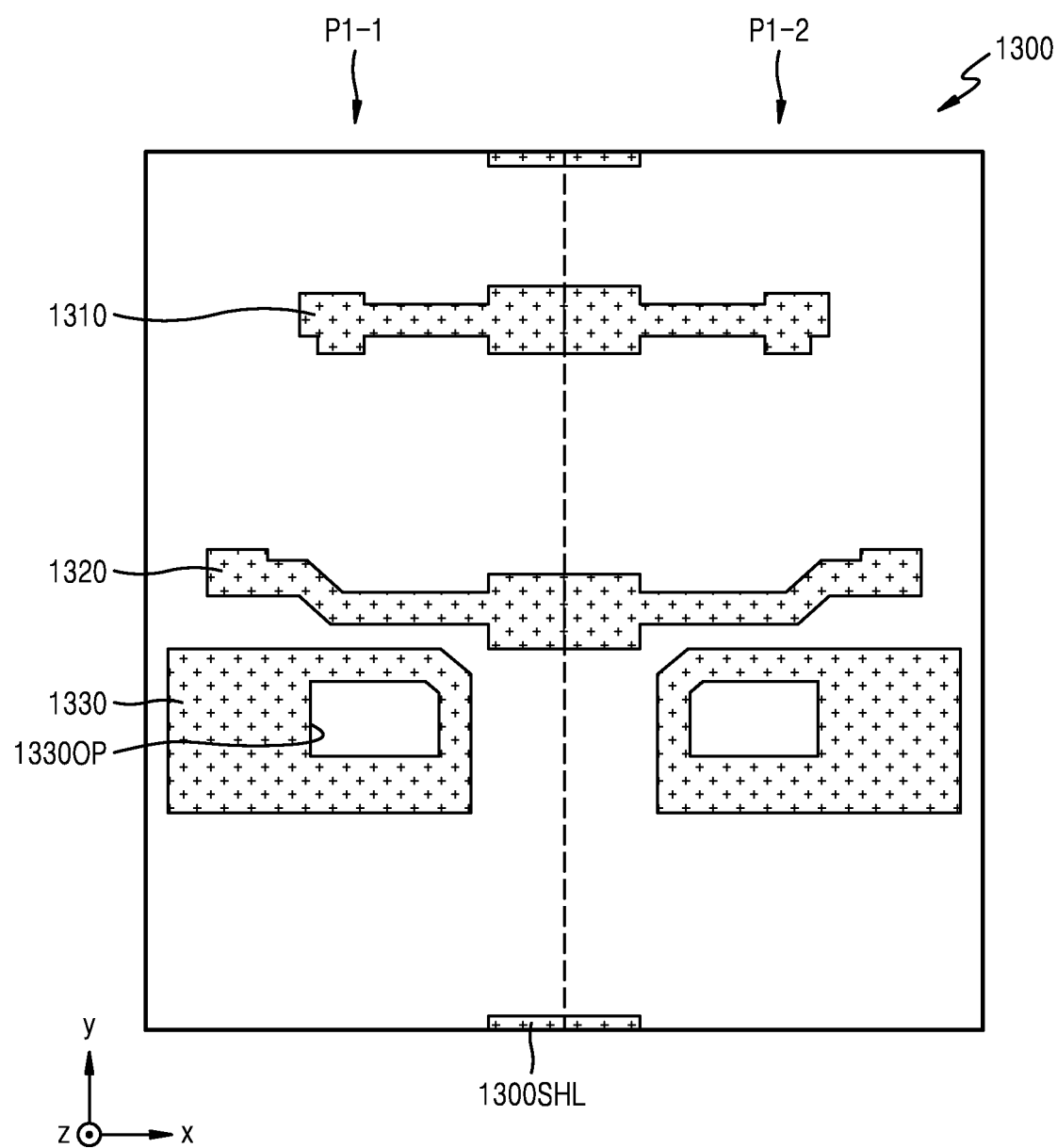

Referring to FIGS. 7A and 7B, the second conductive layer 1300 may include a third gate line 1310, a fourth gate line 1320, and a capacitor upper electrode 1330.

The third gate line 1310 may extend in the first direction (e.g., the x-axis direction). The third gate line 1310 may correspond to the previous scan line SLp of FIG. 3. In a view in a direction (e.g., in the z-axis direction or a plan view) perpendicular to the substrate 100, the third gate line 1310 may be spaced apart from the first gate line 1210. The previous scan signal Sn−1 may be applied to the pixels through the third gate line 1310. A portion of the third gate line 1310 overlapping a second semiconductor layer 1400 described in more detail below may be a first initializing lower gate electrode of the first initializing transistor T4.

The fourth gate line 1320 may also extend in the first direction (e.g., the x-axis direction). The fourth gate line 1320 may correspond to the second scan line SL2 of FIG. 3. In a view in a direction (e.g., in the z-axis direction or a plan view) perpendicular to the substrate 100, the fourth gate line 1320 may be spaced apart from the first gate line 1210 and the third gate line 1310. The second scan signal Sn' may be applied to the pixels through the fourth gate line 1320. A portion of the fourth gate line 1320 overlapping the second semiconductor layer 1400 described in more detail below may be a compensating lower gate electrode of the compensating transistor T3.

The third gate line 1310 and the fourth gate line 1320 may be located under the second semiconductor layer 1400 described in more detail below with reference to FIG. 8 and may function as gate electrodes, and may also function as a lower protection metal protecting portions of the second semiconductor layer 1400 overlapping the third gate line 1310 and the fourth gate line 1320.

The capacitor upper electrode 1330 may overlap the first gate electrode 1220. The capacitor upper electrode 1330 may correspond to the second capacitor electrode CE2 of FIG. 3 to form the storage capacitor Cst together with the first gate electrode 1220. The first power voltage ELVDD may be applied to the capacitor upper electrode 1330. A hole penetrating through the capacitor upper electrode 1330 may be defined or formed in the capacitor upper electrode 1330, and at least a portion of the first gate electrode 1220 may overlap the hole.

The second conductive layer 1300 may include a metal, an alloy, a conductive metal oxide, and/or a transparent conductive material. For example, the second conductive layer 1300 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), and/or indium zinc oxide (IZO). The second conductive layer 1300 may have a multi-layered structure. For example, the second conductive layer 1300 may have a double-layer structure of Mo/Al or a three-layered structure of Mo/Al/Mo.

As shown in FIG. 7B, according to one or more embodiments, the second conductive layer 1300 may further include a second shield layer 1300SHL. For example, when viewed in the direction perpendicular to the upper surface of the substrate 100 (e.g., in the z-axis direction or a plan view), the second shield layer 1300SHL may be arranged to overlap the bridge 1100BR and a portion of the groove GR or the opening of the inorganic insulating layers INL described in more detail below (see, e.g., FIG. 16). According to one or more embodiments, a width of the second shield layer 1300SHL in the first direction (e.g., the x-axis direction) may be greater than the width of the bridge 1100BR in the first direction (e.g., the x-axis direction). The second shield layer 1300SHL may serve to protect the layers therebelow from being damaged when the groove GR or the opening is formed by removing a portion of the inorganic insulating layers INL.

Figure 8:
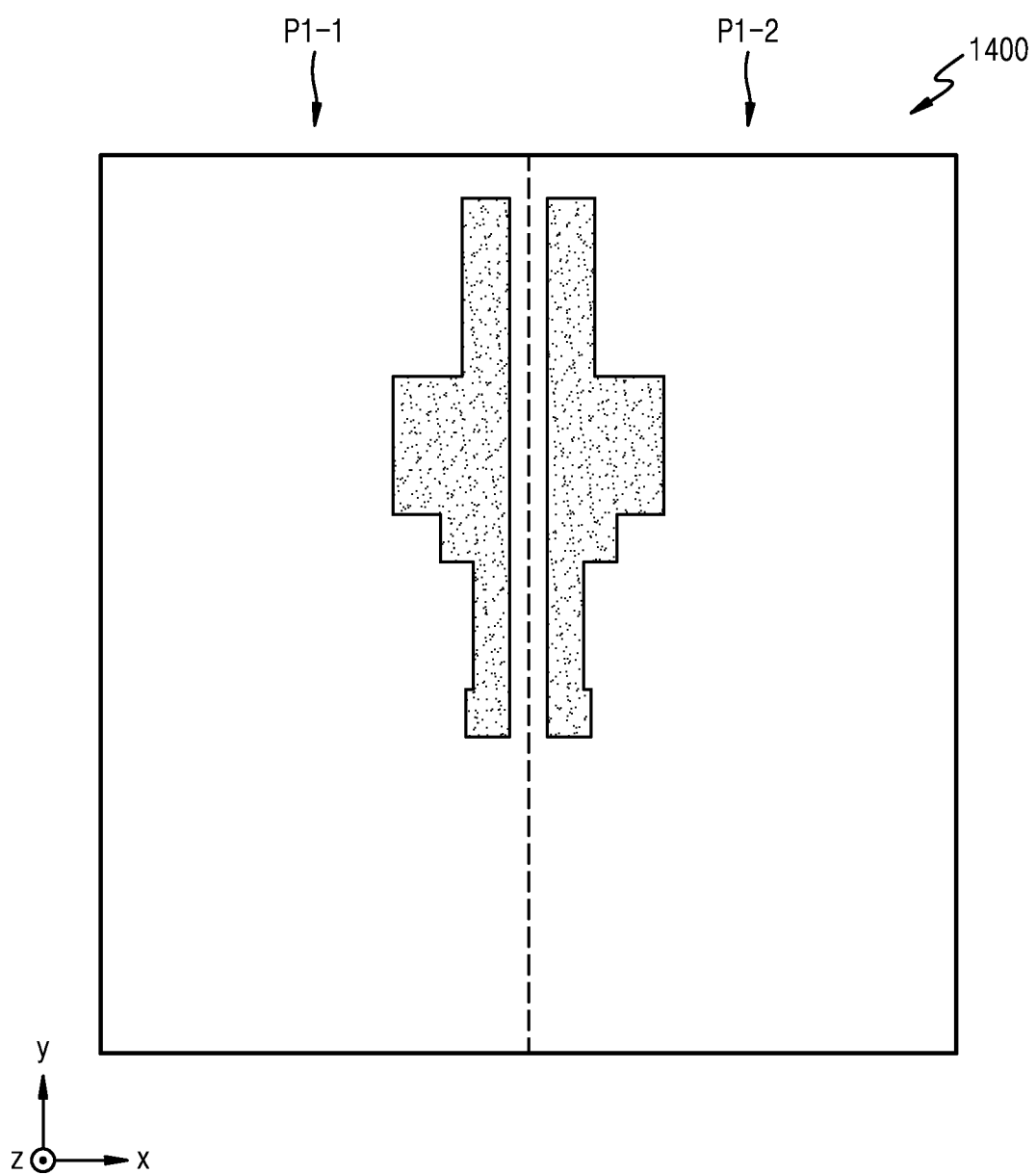

Referring to FIG. 8, the second semiconductor layer 1400 may be arranged in (or at) a different layer from the first semiconductor layer 1100, and may not overlap the first semiconductor layer 1100 in a view in the direction (e.g., in the z-axis direction or a plan view) perpendicular to the substrate 100. As described above, the second semiconductor layer 1400 may include an oxide semiconductor.

Figure 9:
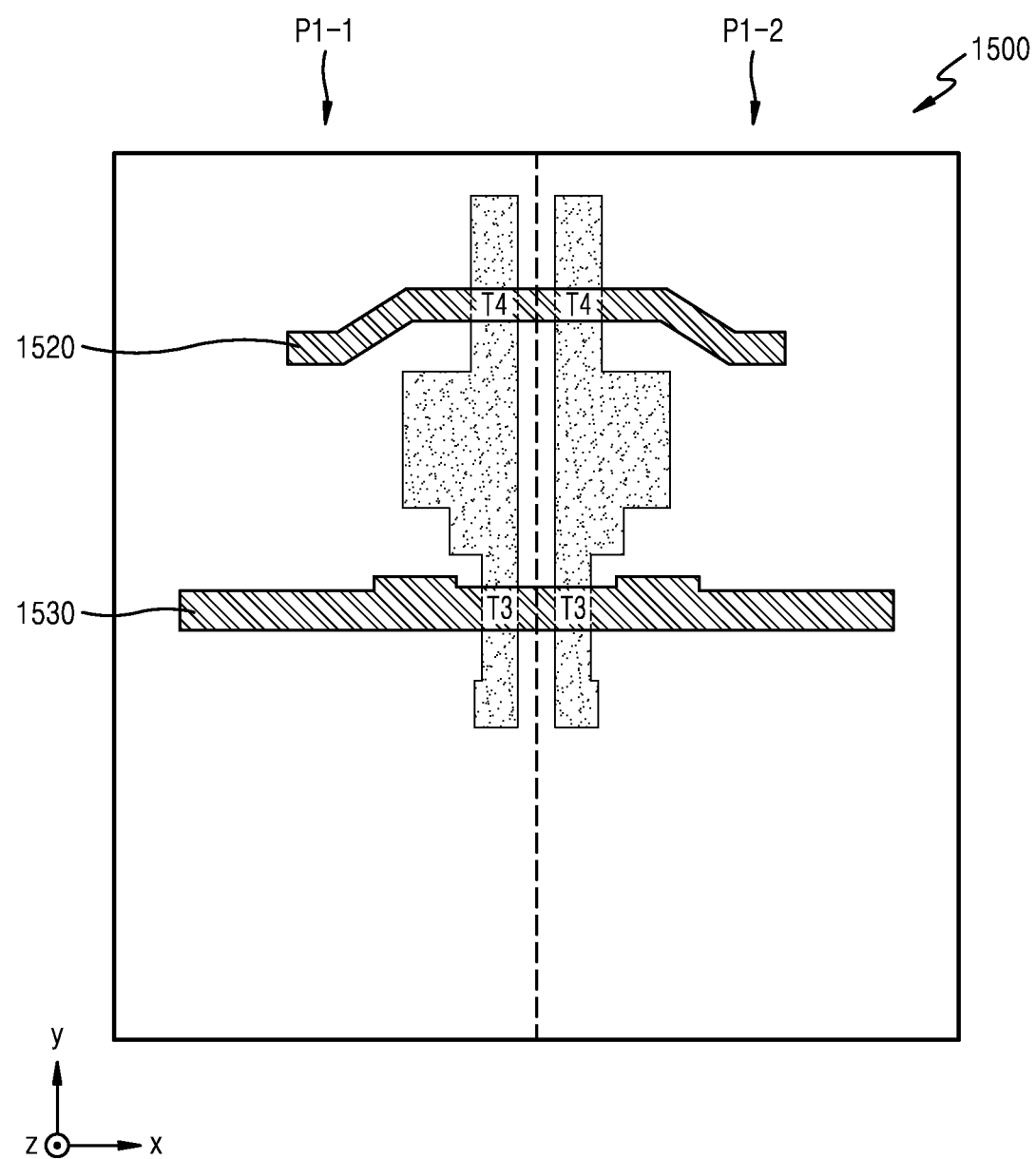

In FIG. 9, for convenience of illustration, a third conductive layer 1500 is illustrated together with the second semiconductor layer 1400. The third conductive layer 1500 may include a fifth gate line 1520 and a sixth gate line 1530.

The fifth gate line 1520 may extend in the first direction (e.g., the x-axis direction). In a view in the direction perpendicular to the substrate 100 (e.g., in the z-axis direction or a plan view), the fifth gate line 1520 may overlap the third gate line 1310. A portion of the fifth gate line 1520 overlapping the second semiconductor layer 1400 may be a first initializing upper gate electrode of the first initializing transistor T4. The fifth gate line 1520 may be electrically connected to the third gate line 1310 as described in more detail below. Accordingly, the fifth gate line 1520 may correspond to the previous scan line SLp of FIG. 3 together with the third gate line 1310. Accordingly, the previous scan signal Sn−1 may be applied to the pixels through the fifth gate line 1520 and/or the third gate line 1310.

The sixth gate line 1530 may extend in the first direction (e.g., the x-axis direction). In a view in the direction perpendicular to the substrate 100 (e.g., in the z-axis direction or a plan view), the sixth gate line 1530 may overlap at least a portion of the fourth gate line 1320. A portion of the sixth gate line 1530 overlapping the second semiconductor layer 1400 may be the compensating lower gate electrode of the compensating transistor T3. As described in more detail below, the sixth gate line 1530 may be electrically connected to the fourth gate line 1320. Accordingly, the sixth gate line 1530 may correspond to the second scan line SL2 of FIG. 3 together with the fourth gate line 1320. Accordingly, the second scan signal Sn' may be applied to the pixels through the sixth gate line 1530 and/or the fourth gate line 1320.

The third conductive layer 1500 may include a metal, an alloy, a conductive metal oxide, and/or a transparent conductive material. For example, the third conductive layer 1500 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), and/or indium zinc oxide (IZO). The third conductive layer 1500 may have a multi-layered structure. For example, the third conductive layer 1500 may have a double-layer structure of Mo/Al or a three-layered structure of Mo/Al/Mo.

Figure 10:
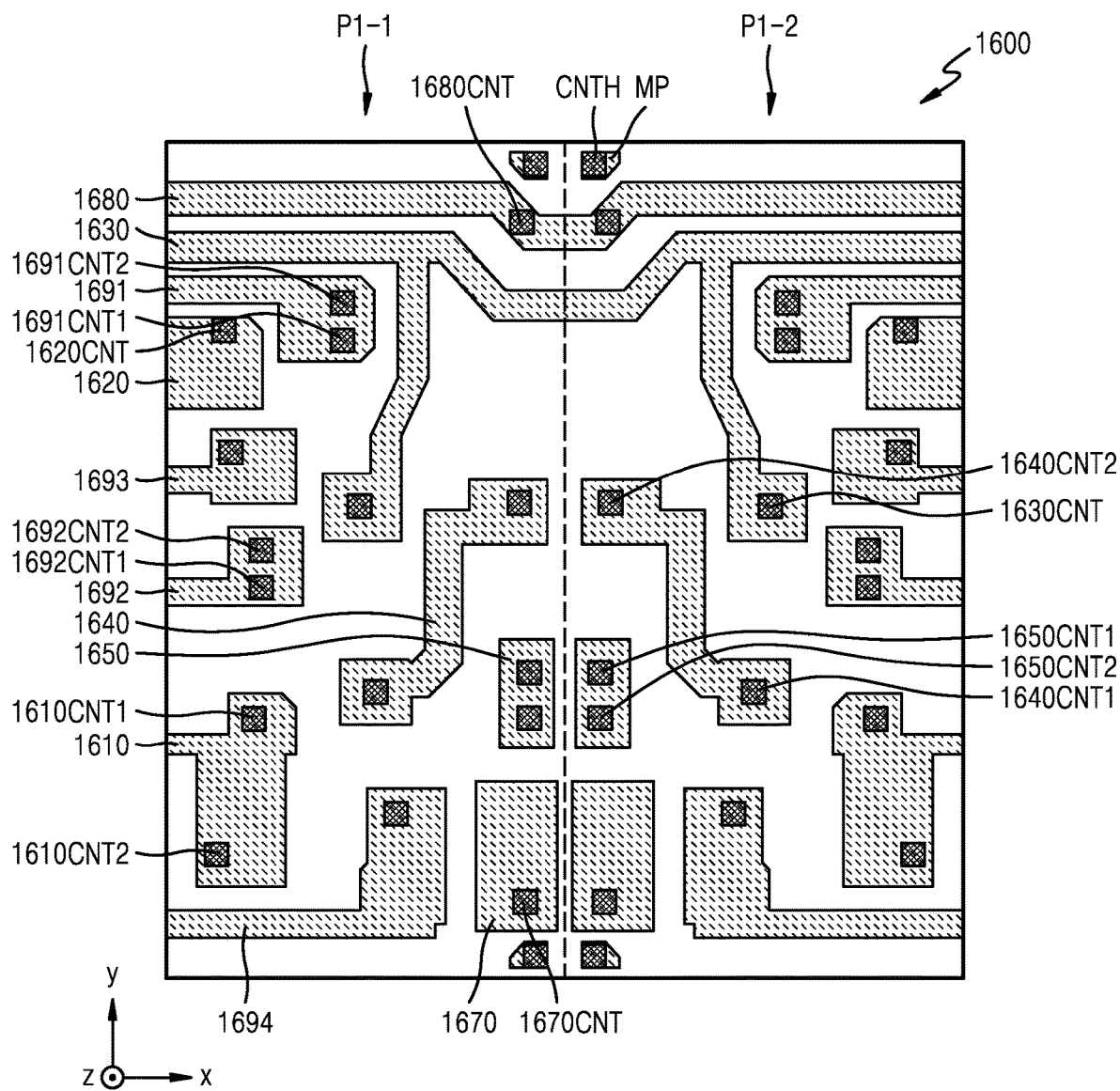

Referring to FIG. 10, a fourth conductive layer 1600 may include a second connection line 1620, a first initialization voltage line 1680 (e.g., the first initialization voltage line VL1 of FIG. 3), a second initialization voltage line 1630 e.g., the second initialization voltage line VL2 of FIG. 3), a third connection line 1640, a fourth connection line 1650, a fifth connection line 1670, a sixth connection line 1610, an eighth connection line 1691, a ninth connection line 1692, a tenth connection line 1693, and an eleventh connection line 1694.

The second connection line 1620 may be electrically connected to the first semiconductor layer 1100 through a contact hole 1620CNT. The data signal Dm from a data line 1710, described in more detail below with reference to FIG. 11, may be transmitted to the first semiconductor layer 1100 through the second connection line 1620 to be applied to the writing transistor T2.

The first initialization voltage line 1680 corresponding to the first initialization voltage line VL1 of FIG. 3 may extend in the first direction (e.g., the x-axis direction). The first initialization voltage Vint1 may be applied to the pixels through the first initialization voltage line 1680. The first initialization voltage line 1680 may at least partially overlap the second semiconductor layer 1400 and may be electrically connected to the second semiconductor layer 1400 through a contact hole 1680CNT to transmit the first initialization voltage Vint1 to the second semiconductor layer 1400, that is, to the first initialization transistor T4.

The second initialization voltage line 1630 corresponding to the second initialization voltage line VL2 of FIG. 3 may extend in the first direction (e.g., the x-axis direction). The second initialization voltage line 1630 may be configured to apply the second initialization voltage Vint2 to the pixels. The second initialization voltage line 1630 may be electrically connected to the first semiconductor layer 1100 through a contact hole 1630CNT, and thus the second initialization voltage Vint2 may be transmitted to the first semiconductor layer 1100 to be applied to the second initialization transistor T7.

The third connection line 1640 may electrically connect the second semiconductor layer 1400 to the first connection line 1540 through contact holes 1640CNT1 and 1640CNT2 defined in one side and the other side thereof. The first initialization voltage Vint1 may be transmitted to the first gate electrode 1220 as a driving gate electrode through the second semiconductor layer 1400, the third connection line 1640, and the first connection line 1540.

The fourth connection line 1650 may electrically connect the second semiconductor layer 1400 to the first semiconductor layer 1100 through contact holes 1650CNT1 and 1650CNT2 defined in one side and the other side portions thereof. In other words, the fourth connection line 1650 may electrically connect the compensation transistor T3 to the driving transistor T1.

The fifth connection line 1670 may be electrically connected to the first semiconductor layer 1100 through a contact hole 1670CNT. The fifth connection line 1670 may be configured to transmit the driving current or the second initialization voltage Vint2 from the first semiconductor layer 1100 to the organic light-emitting diode OLED.

The sixth connection line 1610 may be connected to a power supply voltage line 1730 described in more detail below with reference to FIG. 11, to transmit the first power supply voltage ELVDD from the power supply voltage line 1730 to the capacitor upper electrode 1330 (e.g., the second capacitor electrode CE2 of FIG. 3) through a contact hole 1610CNT1. The sixth connection line 1610 may be configured to transmit the first power supply voltage ELVDD from the power voltage line 1730 to the first semiconductor layer 1100, in one or more embodiments, to the operation control transistor T5 through a contact hole 1610CNT2.

The eighth connection line 1691 is connected to the third gate line 1310 through a contact hole 1691CNT1 and connected to the fifth gate line 1520 through a contact hole 1691CNT2 to electrically connect the third gate line 1310 to the fifth gate line 1520. The eighth connection line 1691 electrically connects the third gate line 1310 of the 1-1$^{st}$ pixel P1-1 to a third gate line of a pixel located adjacent to the 1-1$^{st}$ pixel P1-1 in a −x direction. The eighth connection line 1691 electrically connects the fifth gate line 1520 of the 1-1$^{st}$ pixel P1-1 to a fifth gate line of the pixel located adjacent to the 1-1$^{st}$ pixel P1-1 in the −x direction.

The ninth connection line 1692 is connected to the fourth gate line 1320 through a contact hole 1692CNT1 and connected to the sixth gate line 1530 through a contact hole 1692CNT2 to electrically connect the fourth gate line 1320 to the sixth gate line 1530. The ninth connection line 1692 electrically connects the fourth gate line 1320 of the 1-1$^{st}$ pixel P1-1 to a fourth gate line of the pixel located adjacent to the 1-1$^{st}$ pixel P1-1 in the −x direction. The eighth connection line 1691 electrically connects the sixth gate line 1530 of the 1-1$^{st}$ pixel P1-1 to a sixth gate line of the pixel located adjacent to the 1-1$^{st}$ pixel P1-1 in the −x direction.

The tenth connection line 1693 electrically connects the first gate line 1210 of the 1-1$^{st}$ pixel P1-1 to a first gate line of the pixel located adjacent to the 1-1$^{st}$ pixel P1-1 in the −x direction. The eleventh connection line 1694 electrically connects the second gate line 1230 of the 1-1$^{st}$ pixel P1-1 to a second gate line of the pixel located adjacent to the 1-1$^{st}$ pixel P1-1 in the −x direction.

The fourth conductive layer 1600 may include a metal, an alloy, a conductive metal oxide, and/or a transparent conductive material. For example, the fourth conductive layer 1600 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), and/or indium zinc oxide (IZO). The fourth conductive layer 1600 may have a multi-layered structure. For example, the fourth conductive layer 1600 may have a double-layer structure of Ti/Al or a three-layered structure of Ti/Al/Ti.

According to one or more embodiments, the fourth conductive layer 1600 may include a metal pattern MP. The metal pattern MP may contact an upper surface of the bridge 1100BR of the first semiconductor layer 1100 through a contact hole CNTH. According to one or more embodiments, the metal pattern MP may include the same material as or a different material from other components of the fourth conductive layer 1600. For example, the metal pattern MP may include at least one metal material from among aluminum (Al), titanium (Ti), nickel (Ni), copper (Cu), chromium (Cr), tungsten (W), molybdenum (Mo), or tantalum (Ta) to form polysilicon and a silicide material that constitute the first semiconductor layer 1100. According to one or more embodiments, the metal pattern MP may be included in the first conductive layer 1200.

Figure 11:
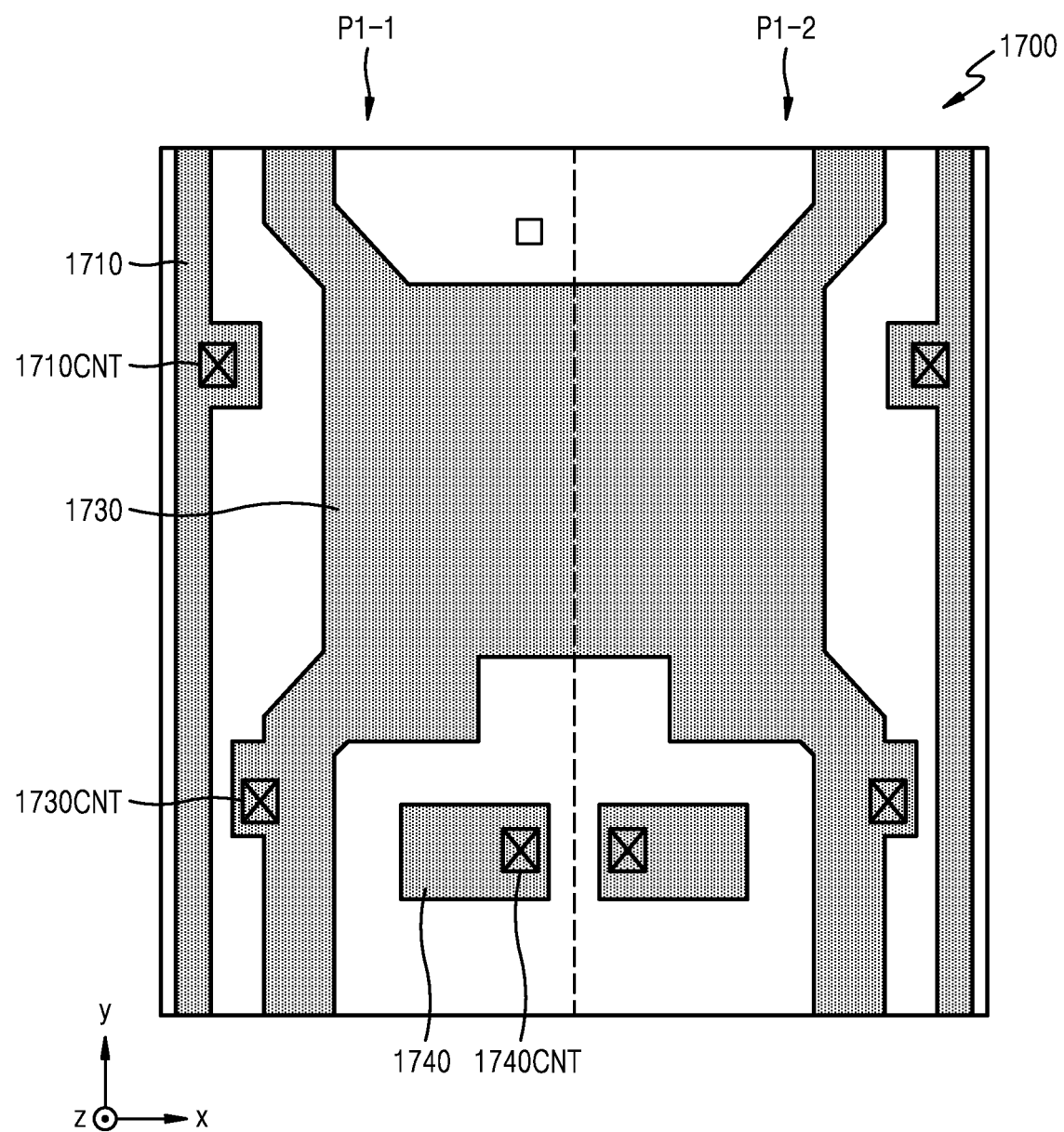

Referring to FIG. 11, a fifth conductive layer 1700 may include a data line 1710, a power supply voltage line 1730, and a seventh connection line 1740.

The data line 1710 may extend in a second direction (e.g., the y-axis direction). The data line 1710 may correspond to the data line DL of FIG. 3. The data line 1710 may be electrically connected to the second connection line 1620 through a contact hole 1710CNT and thus the data signal Dm from the data line 1710 may be transmitted to the first semiconductor layer 1100 through the second connection line 1620 and applied to the writing transistor T2.

The power supply voltage line 1730 may extend substantially in the second direction (e.g., the y-axis direction). The power supply voltage line 1730 may correspond to the first power supply voltage line PL of FIG. 3. The power supply voltage line 1730 may be configured to apply the first power supply voltage ELVDD to the pixels. The power supply voltage line 1730 may be electrically connected to the sixth connection line 1610 through a contact hole 1730CNT to transmit the first power supply voltage ELVDD to the operation control transistor T5 and the capacitor upper electrode 1330 as described above. The power supply voltage line 1730 of the 1-$1^{st}$ pixel P1-1 may be integrally formed with the power supply voltage line 1730 of the 1-$2^{nd}$ pixel P1-2 adjacent thereto.

The seventh connection line 1740 is electrically connected to the fifth connection line 1670 through a contact hole 1740CNT1. The seventh connection line 1740 is electrically connected to a pixel electrode 210 (see, e.g., FIG. 18A) of an organic light-emitting diode OLED through a contact hole 1740CNT2 formed in an insulating layer located thereover. Accordingly, the driving current or the second initialization voltage Vint2 from the first semiconductor layer 1100 may be transmitted to the pixel electrode 210 of the organic light-emitting diode OLED through the fifth connection line 1670 and the seventh connection line 1740.

The fifth conductive layer 1700 may include a metal, an alloy, a conductive metal oxide, and/or a transparent conductive material. For example, the fifth conductive layer 1700 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), and/or indium zinc oxide (IZO). The fifth conductive layer 1700 may have a multi-layered structure. For example, the fifth conductive layer 1700 may have a double-layer structure of Ti/Al or a three-layered structure of Ti/Al/Ti.

The first semiconductor layer 1100, the first conductive layer 1200, the second conductive layer 1300, the second semiconductor layer 1400, the third conductive layer 1500, the fourth conductive layer 1600, and the fifth conductive layer 1700 may be sequentially stacked on the substrate 100 of FIG. 18A. As will be described in more detail later, insulating layers may be disposed between the first semiconductor layer 1100, the first conductive layer 1200, the second conductive layer 1300, the second semiconductor layer 1400, the third conductive layer 1500, the fourth conductive layer 1600, and the fifth conductive layer 1700, and the insulating layers may have a groove GR or an opening corresponding to at least a portion of a boundary between adjacent pixels.

When an external impact is applied to the display apparatus, a crack may occur in an insulating layer including an inorganic material inside the display apparatus. Such a crack generated in a pixel area may grow along the insulating layer including the inorganic material inside the display apparatus and may extend to an adjacent pixel area. Accordingly, a defect may occur in a plurality of pixels. However, the display apparatus according to one or more embodiments of the present disclosure may prevent or minimize (or reduce) the growth of such a crack.

FIGS. 12 to 15 are plan views schematically illustrating, in a plurality of pixels, a first semiconductor layer included in a display apparatus according to one or more embodiments of the present disclosure.

Figure 12:
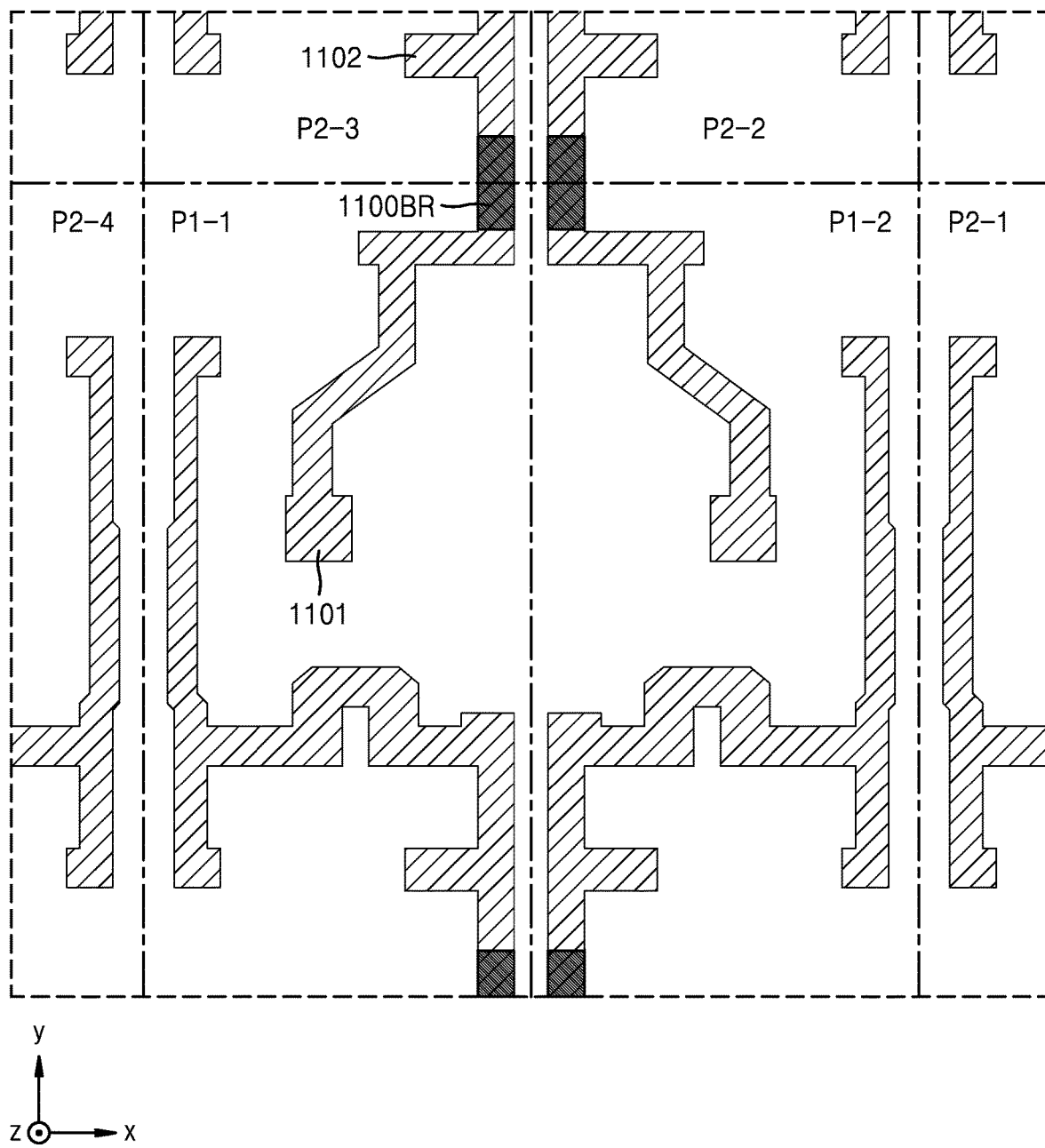
FIGS. 12 to 15 are plan views schematically illustrating, in a plurality of pixels, a semiconductor layer included in a display apparatus according to one or more embodiments of the present disclosure.

Referring to FIGS. 12 to 15, a 1-$1^{st}$ semiconductor layer 1101 located in the 1-$1^{st}$ pixel P1-1 may be connected to a 1-$2^{nd}$ semiconductor layer 1102 located in a 2-$3^{rd}$ pixel P2-3 adjacent to the 1-$1^{st}$ pixel P1-1 in a +y direction, by the bridge 1100BR. The 1-$1^{st}$ semiconductor layer 1101, the 1-$2^{nd}$ semiconductor layer 1102, and the bridge 1100BR may be integrated with one another as shown in FIG. 12. The bridge 1100BR may pass through a groove GR (see, e.g., FIG. 16) located on a boundary between an area of the 1-$1^{st}$ pixel P1-1 and an area of the 2-$3^{rd}$ pixel P2-3.

As such, the 1-$1^{st}$ semiconductor layer 1101 located in the 1-$1^{st}$ pixel P1-1 and the 1-$2^{nd}$ semiconductor layer 1102 located in the 2-$3^{rd}$ pixel P2-3 may be interconnected by the bridge 1100BR integrally formed with the 1-$1^{st}$ semiconductor layer 1101 and the 1-$2^{nd}$ semiconductor layer 1102, instead of being interconnected by a conductive layer located in a different layer than the 1-$1^{st}$ semiconductor layer 1101 and the 1-$2^{nd}$ semiconductor layer 1102, to thereby simplify a connection structure thereof to reduce the size of each pixel. Thus, a high-resolution display apparatus may be realized.

The bridge 1100BR may include a silicide material. For example, the bridge 1100BR may include a silicide material formed by forming a metal pattern MP (see, e.g., FIG. 21A) including at least one element from among aluminum (Al), titanium (Ti), nickel (Ni), copper (Cu), chromium (Cr), tungsten (W), molybdenum (Mo), or tantalum (Ta) on a polysilicon pattern and thermally treating the metal pattern MP. Thus, the bridge 1100BR has a low modulus, so that a display apparatus having a low rate of occurrence of defects due to external impacts may be implemented.

Figure 13:
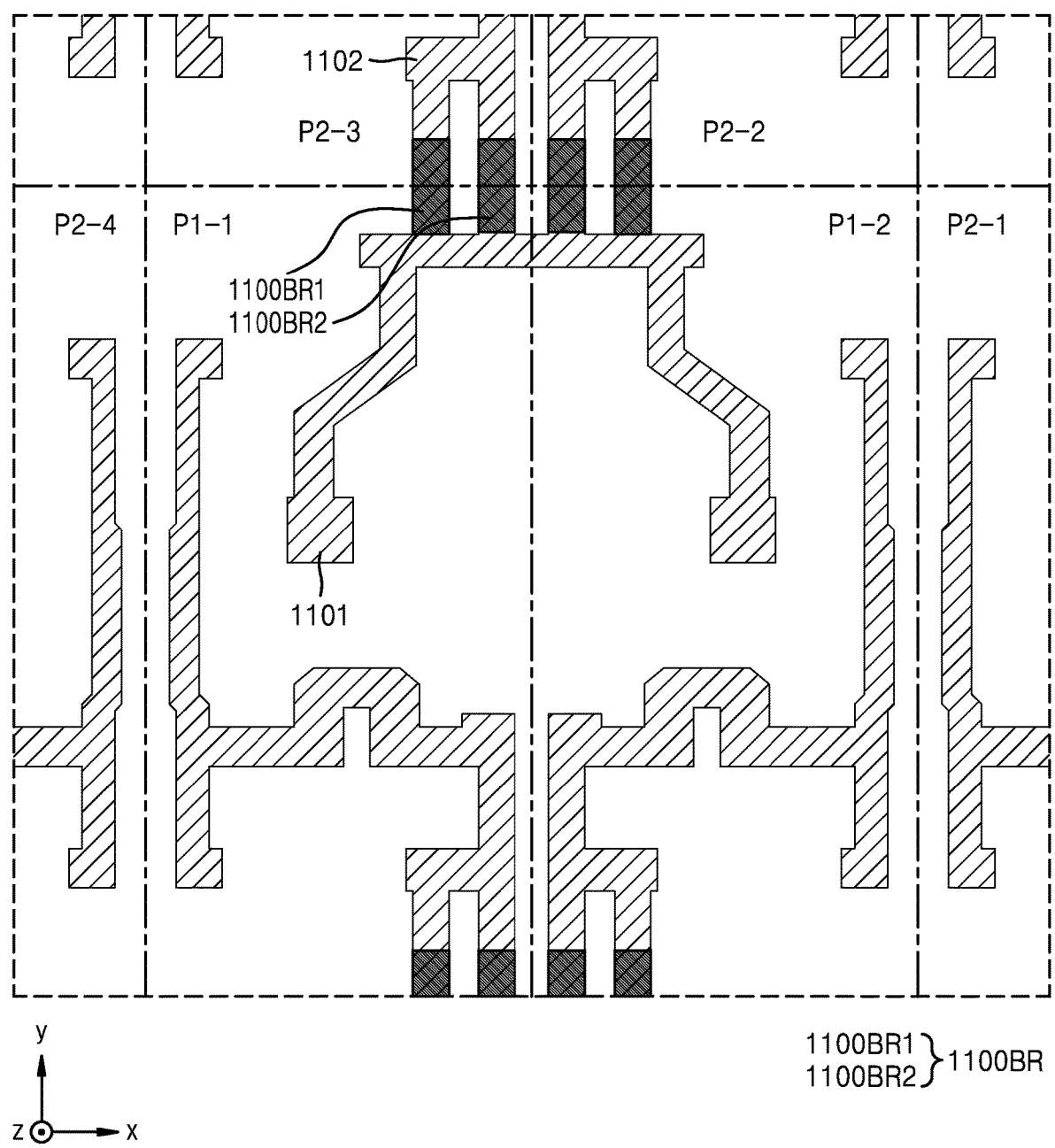
Figure 14:
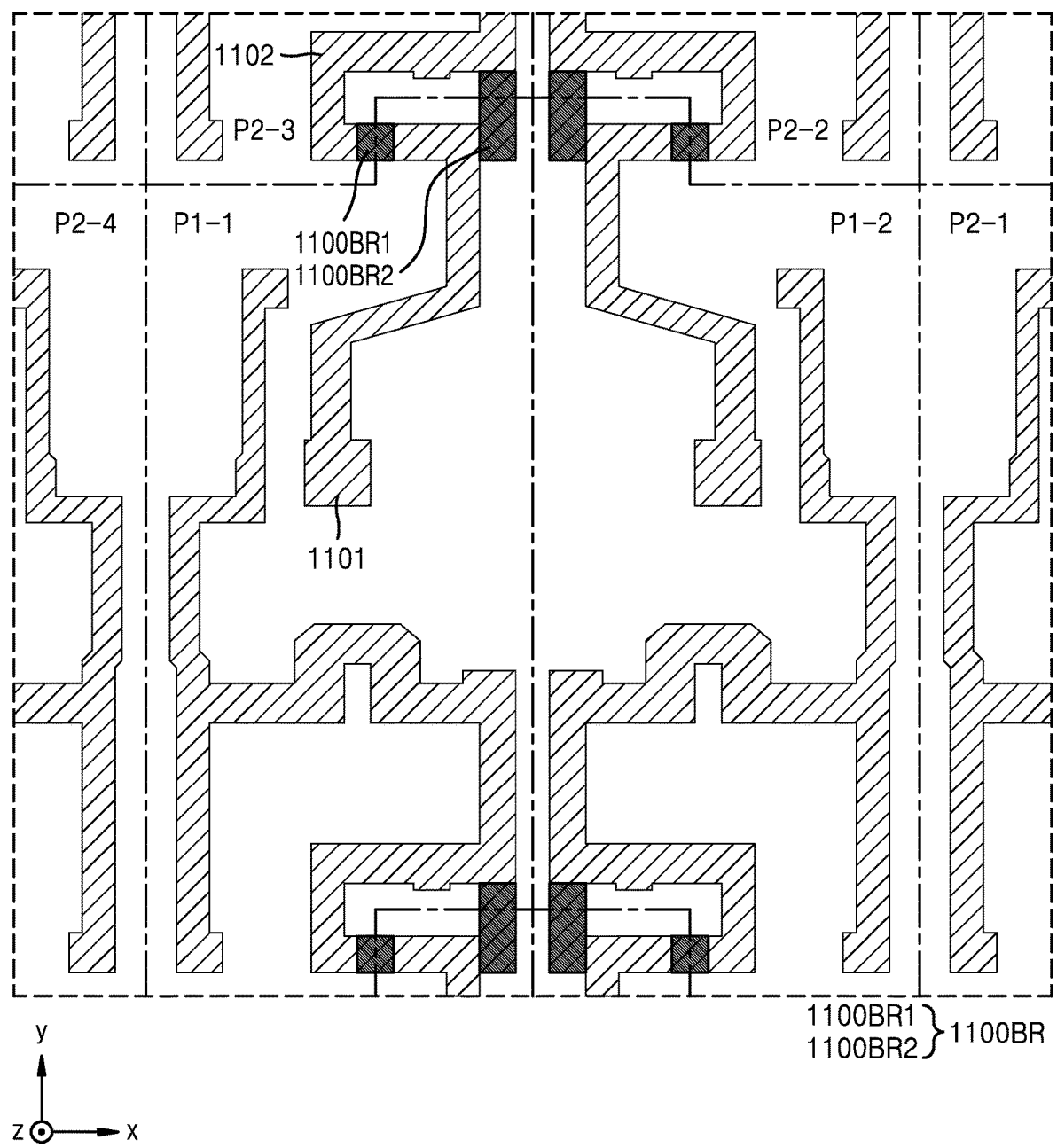

As illustrated in FIGS. 13 and 14, a plurality of bridges 1100BR may be included. For example, the bridge 1100BR may include a first bridge 1100BR1 and a second bridge 1100BR2. Referring to FIG. 13, the first bridge 1100BR1 and the second bridge 1100BR2 may be arranged in parallel to each other and may connect the 1-$1^{st}$ semiconductor layer 1101 located in the 1-$1^{st}$ pixel P1-1 to the 1-$2^{nd}$ semiconductor layer 1102 located in the 2-$3^{rd}$ pixel P2-3 adjacent to the 1-$1^{st}$ pixel P1-1 in the +y direction. Due to the inclusion of the plurality of bridges 1100BR, even when a crack or a short-circuit occurs in one bridge, the other bridge may electrically connect the 1-$1^{st}$ semiconductor layer 1101 located in the 1-$1^{st}$ pixel P1-1 to the 1-$2^{nd}$ semiconductor layer 1102 located in the 2-3$^{rd}$ pixel P2-3, thereby reducing the rate of occurrence of defects due to external impacts.

Referring to FIG. 14, according to one or more embodiments, a pixel area corresponding to each pixel may have a shape protruding in the second direction (+y direction). For example, a boundary between the 1-2$^{nd}$ pixel P1-2 and the 2-3$^{rd}$ pixel P2-3 may be bent in the second direction (+y direction). The bridge 1100BR may include a first bridge 1100BR1 extending in the first direction (+x direction) and a second bridge 1100BR2 extending in the second direction (+y direction). Because the first bridge 1100BR1 and the second bridge 1100BR2 extend in different directions, both the first and second bridges 1100BR1 and 1100BR2 may be prevented from short-circuiting (or short-circuits may be reduced).

Figure 15:
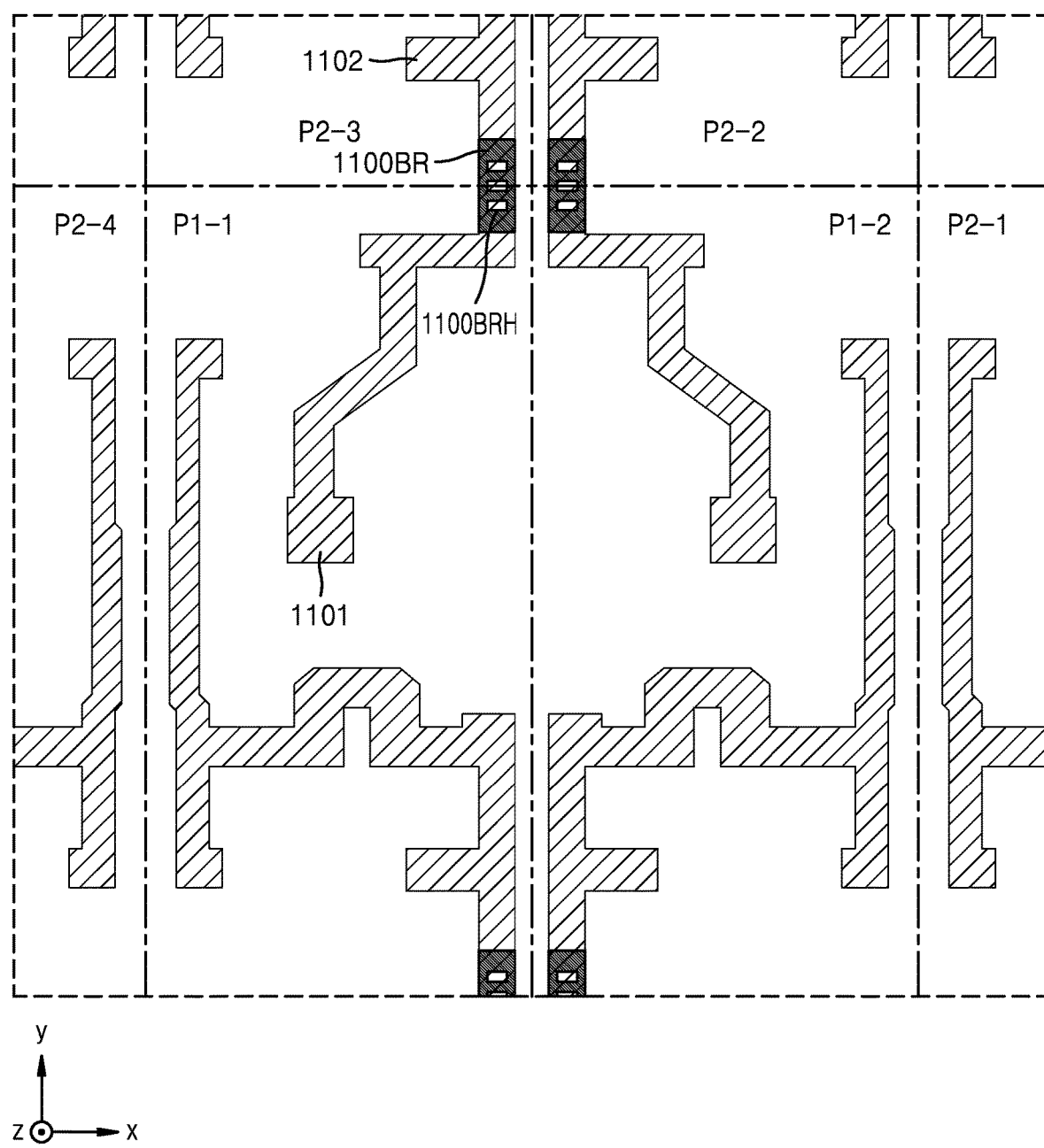

Referring to FIG. 15, the bridge 1100BR may have a plurality of through holes 1100BRH. FIG. 15 illustrates one or more embodiments where the bridge 1100BR has three through holes 1100BRH spaced apart from one another in the extension direction (e.g., the y-axis direction). According to one or more embodiments, the through holes 1100BRH may be in the shape of slits spaced apart from one another in a direction (e.g., the x-axis direction) perpendicular to the extension direction of the bridge 1100BR. Although the through holes 1100BRH are each shown in a rectangular shape in FIG. 15, they may have various shapes such as a circular shape, a polygonal shape, and a chamfered quadrangular shape, and the number of through holes 1100BRH may also vary according to the designs thereof. The plurality of through holes 1100BRH may contribute to a decrease in occurrence of a crack or short-circuit of the bridge 1100BR, thereby reducing the rate of occurrence of defects due to external impacts.

Figure 16:
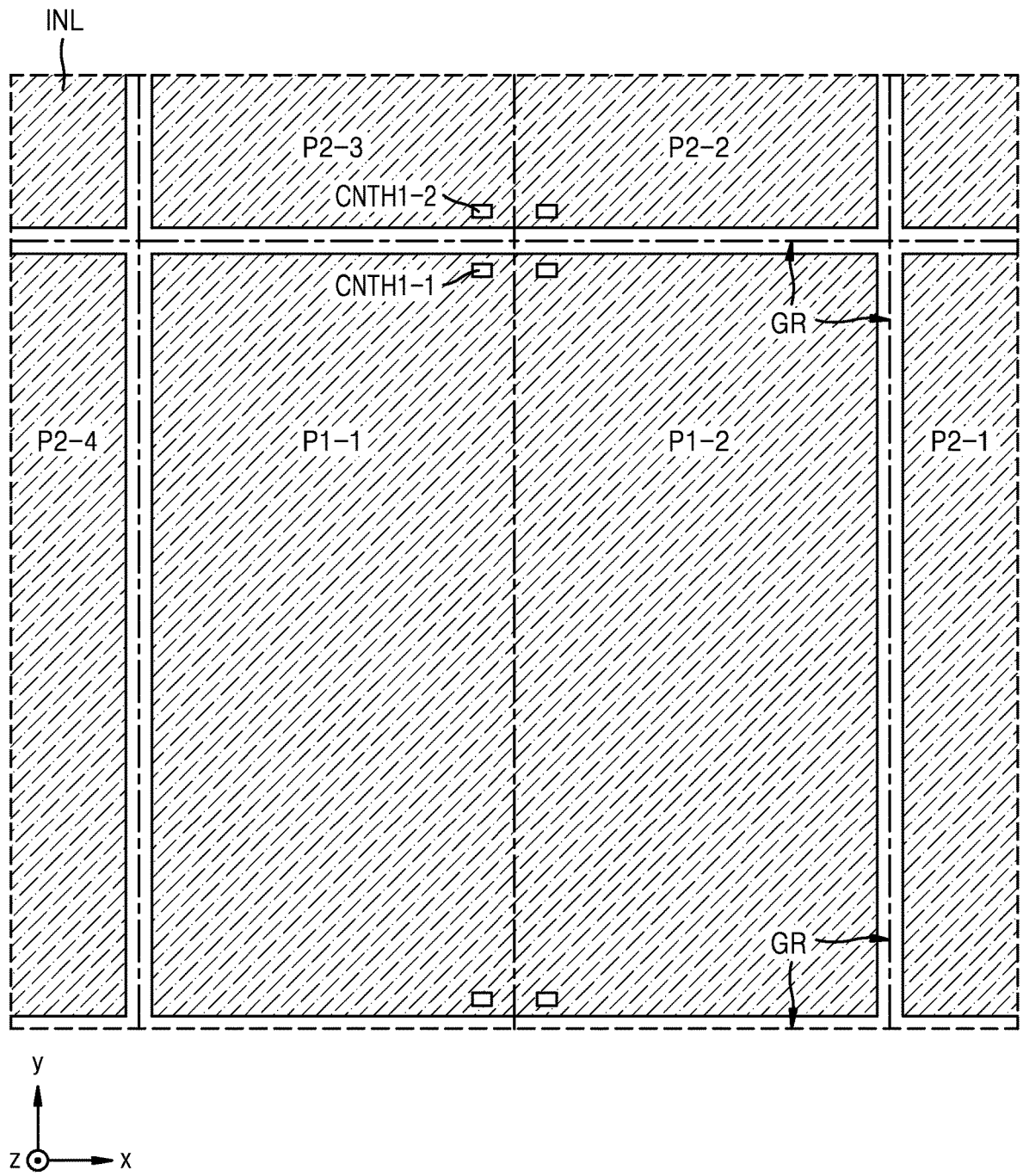
FIGS. 16 and 17 are plan views schematically illustrating, in a plurality of pixels, insulating layers included in display apparatuses according to one or more embodiments of the present disclosure.
Figure 17:
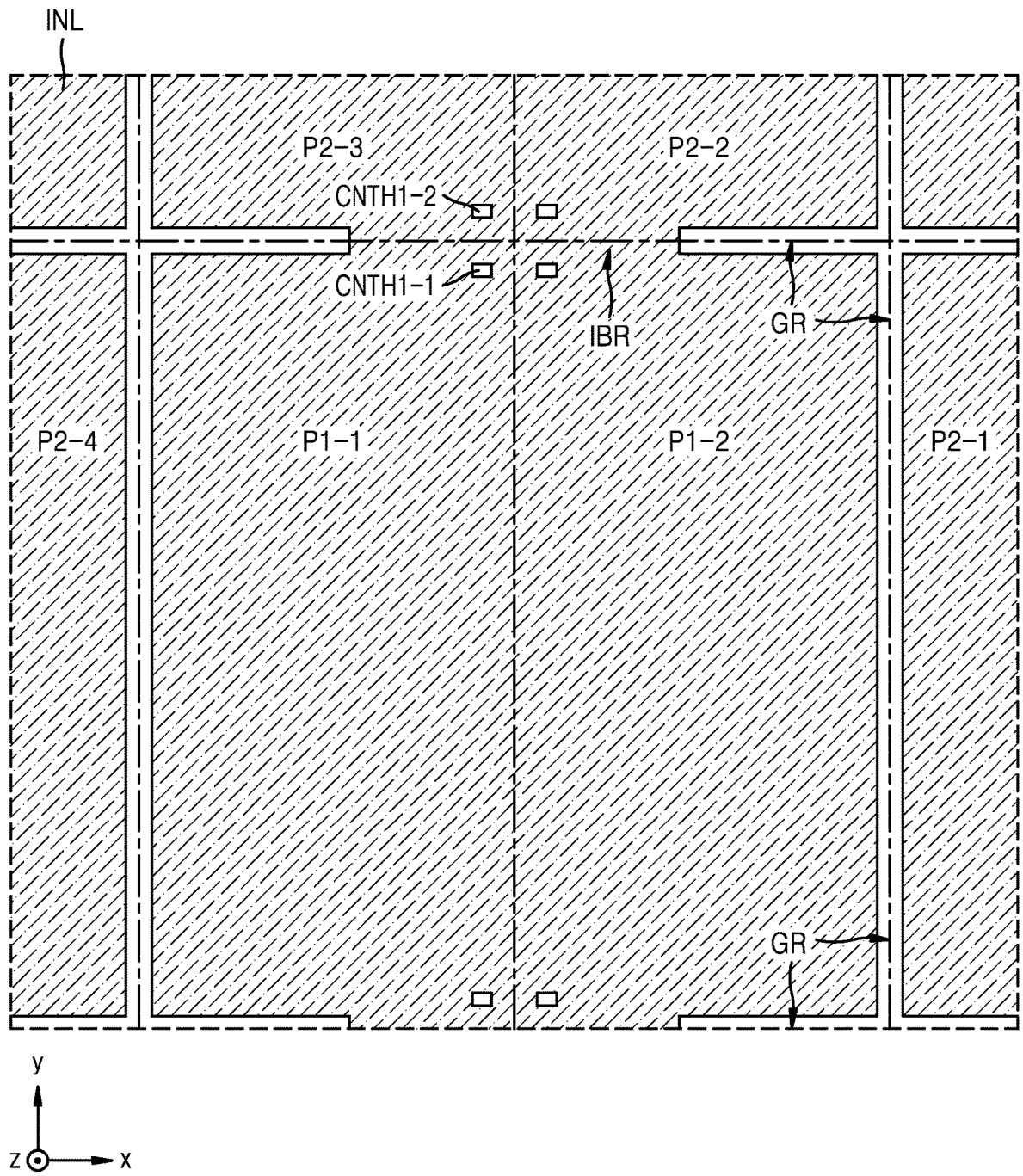

FIGS. 16 and 17 are plan views schematically illustrating, in a plurality of pixels, inorganic insulating layers included in a display apparatus according to one or more embodiments of the present disclosure.

Referring to FIG. 16, at least some of the inorganic insulating layers INL arranged between the first semiconductor layer 1100 and the fourth conductive layer 1600 may include a groove GR or first opening corresponding to at least a portion of a pixel boundary. For example, the groove GR may extend in the first direction (e.g., the x-axis direction) along a boundary between the 1-1$^{st}$ pixel P1-1 and the 2-3$^{rd}$ pixel P2-3 and a boundary between the 1-2$^{nd}$ pixel P1-2 and the 2-2$^{nd}$ pixel P2-2, and may extend in the second direction (e.g., the y-axis direction) along a boundary between the 1-1$^{st}$ pixel P1-1 and the 2-4$^{th}$ pixel P2-4 and a boundary between the 1-2$^{nd}$ pixel P1-2 and the 2-1$^{st}$ pixel P2-1.

According to one or more embodiments, the inorganic insulating layers INL may selectively include contact holes CNTH exposing an upper surface of the bridge 1100BR of the first semiconductor layer 1100. For example, a 1-1$^{st}$ contact hole CNTH1-1 and a 1-2$^{nd}$ contact hole CNTH1-2 may be arranged to expose both ends of the bridge 1100BR connecting the 1-1$^{st}$ pixel P1-1 and the 2-3$^{rd}$ pixel P2-3 adjacent to each other. According to one or more embodiments, the contact holes CNTH may be removed while the groove GR is being formed.

Referring to FIG. 17, when the first conductive layer 1200 includes the first shield layer 1200SHL as shown, for example, in FIG. 6B, the inorganic insulating layers INL located between the first semiconductor layer 1100 and the first conductive layer 1200 may further include an insulation bridge IBR overlapping the first shield layer 1200SHL when viewed in a direction perpendicular to a substrate (e.g., in the z-axis direction or a plan view). According to one or more embodiments, when the second conductive layer 1300 includes the second shield layer 1300SHL, as shown, for example, in FIG. 7B, the inorganic insulating layers INL located between the first semiconductor layer 1100 and the second conductive layer 1300 may further include an insulation bridge IBR overlapping the second shield layer 1300SHL when viewed in the direction perpendicular to the substrate (e.g., the z-axis direction or a plan view). According to one or more embodiments, a width of the insulation bridge IBR in the first direction (e.g., the x-axis direction) may be greater than the width of the bridge 1100BR in the first direction (e.g., the x-axis direction).

FIGS. 16 and 17 illustrate one or more embodiments where the inorganic insulating layers INL have a contact hole CNTH. However, according to one or more embodiments, when a metal pattern for siliciding the bridge 1100BR of FIG. 5 is included in the first conductive layer 1200, the inorganic insulating layers INL arranged between the first conductive layer 1200 and the fourth conductive layer 1600 may include no contact holes CNTH.

Figure 18B:
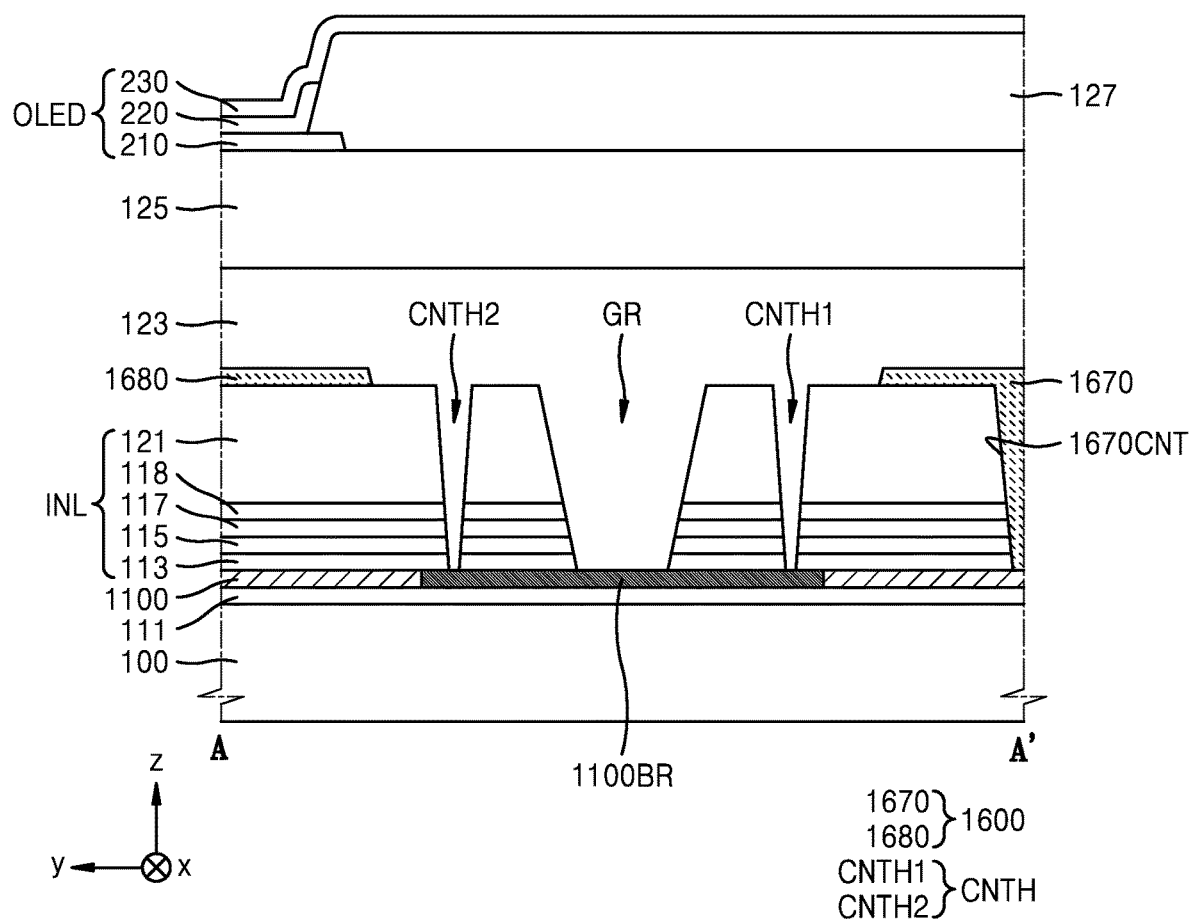
Figure 18C:
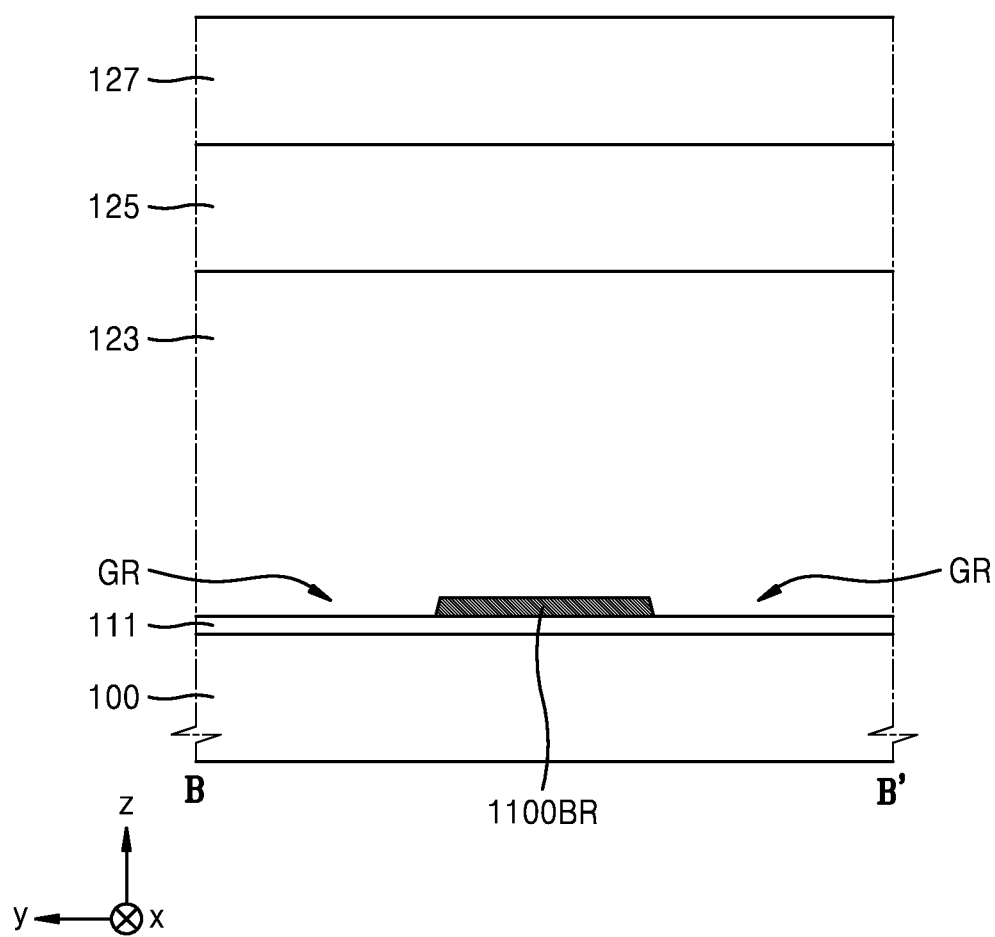
FIG. 18C is a schematic cross-sectional view taken along the line B-B' of FIG. 4, according to one or more embodiments of the present disclosure.

FIGS. 18A and 18B are schematic cross-sectional views taken along the line A-A' of FIG. 4, according to one or more embodiments of the present disclosure, and FIG. 18C is a schematic cross-sectional view taken along the line B-B' of FIG. 4, according to one or more embodiments of the present disclosure.

Referring to FIGS. 18A and 18B, a buffer layer 111 including silicon oxide, silicon nitride, and/or silicon oxynitride may be located on the substrate 100. The buffer layer 111 may prevent (or substantially prevent) metal atoms, impurities, or the like from the substrate 100 from being diffused into a first semiconductor layer 1100 located thereover. The buffer layer 111 may control a heat supply rate during a crystallization process for forming the first semiconductor layer 1100, such that the first semiconductor layer 1100 may be uniformly crystallized.

According to one or more embodiments, a lower metal layer may be further disposed on the buffer layer 111. The lower metal layer may serve to prevent (or substantially prevent) the substrate 100 and any other suitable layers present under the lower metal layer from being damaged when the groove GR is formed. In a view in the direction perpendicular to the substrate 100 (e.g., in the z-axis direction or a plan view), the lower metal layer may substantially overlap the groove GR. According to one or more embodiments, the lower metal layer may be disposed in (or at) the same layer as the first conductive layer 1200.

The first semiconductor layer 1100 shown in FIG. 5 may be disposed on the buffer layer 111. The first semiconductor layer 1100 may include the bridge 1100BR. The bridge 1100BR may be disposed to overlap the groove GR. The first semiconductor layer 1100 may include a silicon semiconductor. For example, the first semiconductor layer 1100 may include amorphous silicon and/or polysilicon. In one or more embodiments, the first semiconductor layer 1100 may include polysilicon crystallized at low temperature. In one or more embodiments, ions may be implanted into at least a portion of the first semiconductor layer 1100. As described above, the bridge 1100BR may include a silicide material. According to one or more embodiments, at least a portion of the metal pattern MP of FIG. 10 after a siliciding process may be located on the upper surface of the bridge 1100BR.

A first insulating layer 113 may cover the first semiconductor layer 1100 and may be disposed on the substrate 100. The first insulating layer 113 may include an insulating material. For example, the first insulating layer 113 may include silicon oxide ($SiO_x$), silicon nitride ($SiN_x$), silicon oxynitride (SiON), and/or aluminum oxynitride ($Al_2O_3$).

The first conductive layer 1200 shown in FIG. 6 may be located on the first insulating layer 113. A second insulating layer 115 may cover the first conductive layer 1200 and may be located on the first insulating layer 113. The second insulating layer 115 may include the same material as or a similar material to the first insulating layer 113.

The second conductive layer 1300 shown in FIG. 7 may be located on the second insulating layer 115. A third insulating layer 117 may cover the second conductive layer 1300 and may be located on the second insulating layer 115. The third insulating layer 117 may include the same material as or a similar material to the first insulating layer 113.

The second semiconductor layer 1400 shown in FIG. 8 may be located on the third insulating layer 117. A fourth insulating layer 118 may cover the second semiconductor layer 1400 and may be disposed on the third insulating layer 117. The fourth insulating layer 118 may include the same material as or a similar material to the first insulating layer 113.

The third conductive layer 1500 shown in FIG. 9 may be located on the fourth insulating layer 118. A first planarization layer 121 may cover the third conductive layer 1500. The first planarization layer 121 may include an inorganic insulating material or an organic insulating material. For example, the first planarization layer 121 may include silicon oxide ($SiO_x$), silicon nitride ($SiN_x$), silicon oxynitride (SiON), and/or aluminum oxynitride ($Al_2O_3$).

According to one or more embodiments, the inorganic insulating layers INL may include the first insulating layer 113, the second insulating layer 115, the third insulating layer 117, the fourth insulating layer 118, and the first planarization layer 121. The inorganic insulating layers INL have (or define) the groove GR or the opening. A portion of the groove GR or opening may correspond to a boundary between adjacent pixel areas. Here, the term "groove" may refer to a groove formed in an insulating layer, and a depth of the groove may be less than a thickness of the insulating layer. The opening refers to an opening that penetrates the insulating layer vertically (e.g., in the z-axis direction). When the inorganic insulating layers INL have (or define) an opening penetrating through the inorganic insulating layers INL, the buffer layer 111 may further include a groove that overlaps the opening.

A crack may be formed in the insulating layer in an area of one pixel, due to an external impact. However, as illustrated in FIGS. 18A to 18C, when the inorganic insulating layers INL include a groove, such a crack may reach the groove GR while growing toward an adjacent pixel area, and accordingly, the growth of the crack may stop. As such, aspects of the display apparatus according to one or more embodiments of the present disclosure may effectively prevent or minimize (or reduce) the growth of a crack formed in an insulating layer including an inorganic material in a pixel due to an external impact, into an adjacent pixel.

According to one or more embodiments, as illustrated in FIG. 18B, at least a portion or the entirety of the inorganic insulating layers INL may include a contact hole CNTH. The contact hole CNTH may expose the upper surface of the bridge 1100BR by penetrating through a portion or the entirety of the inorganic insulating layers INL. For example, when the metal pattern MP for forming a silicide material is included in the fourth conductive layer 1600 of FIG. 12, the contact hole CNTH may expose the upper surface of the bridge 1100BR by penetrating through the first insulating layer 113, the second insulating layer 115, the third insulating layer 117, the fourth insulating layer 118, and the first planarization layer 121. According to one or more embodiments, when the metal pattern MP is included in the first conductive layer 1200 of FIG. 6A, the contact hole CNTH may be formed to penetrate through only the first insulating layer 113.

As illustrated in FIG. 18B, according to one or more embodiments, the contact hole CNTH may be disposed to be adjacent to both ends of the bridge 1100BR and overlap the bridge 1100BR. For example, a first contact hole CNTH1 may be disposed adjacent to the fifth connection line 1670 of one pixel around the groove GR, and a second contact hole CNTH2 may be disposed adjacent to the sixth connection line 1680 of another adjacent pixel around the groove GR. The metal pattern MP may contact the upper surface of the bridge 1100BR via the contact hole CNTH and silicide the bridge 1100BR.

The fourth conductive layer 1600 shown in FIG. 10 may be located on the first planarization layer 121. A second insulating layer 123 may cover the fourth conductive layer 1600 and may be located on the first planarization layer 121. The second insulating layer 123 may include an organic insulating material. For example, the second insulating layer 123 may include photoresist, benzocyclobutene (BCB), polyimide, hexamethyldisiloxane (HMDSO), polymethyl methacrylate (PMMA), polystyrene, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, and/or a blend or combination thereof.

The second planarization layer 123 may fill the groove GR. In one or more embodiments, as illustrated in FIG. 18B, the second planarization layer 123 may fill the groove GR and the contact hole CNTH. The second planarization layer 123 includes an organic insulating material as described above. Thus, a crack occurring in the insulating layer including an inorganic material and grown along the insulating layer does not grow any further when it reaches the second planarization layer 123 including an organic insulating material.

A third planarization layer 125 may cover the fifth conductive layer 1700 and may be located on the second planarization layer 123. The third planarization layer 125 may include an organic insulating material. For example, the third planarization layer 125 may include photoresist, benzocyclobutene (BCB), polyimide, hexamethyldisiloxane (HMDSO), polymethyl methacrylate (PMMA), polystyrene, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, and/or a blend or combination thereof.

The organic light-emitting diode OLED may be located on the third planarization layer 125. The organic light-emitting diode OLED may include the pixel electrode 210, an intermediate layer 220 including an emission layer, and an opposite electrode 230.

The pixel electrode 210 may be a (semi) light-transmissive electrode or a reflective electrode. For example, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a transparent or semi-transparent electrode layer located on the reflective layer. The transparent or semi-transparent electrode layer may include at least one of indium tin oxide (ITO), indium zinc oxide (IZO), zinc oxide (ZnO), indium oxide (In$_2$O$_3$), indium gallium oxide (IGO), or aluminum zinc oxide (AZO). For example, the pixel electrode 210 may have a three-layered structure of ITO/Ag/ITO.

A pixel defining layer 127 may be arranged on the third planarization layer 125. The pixel defining layer 127 may prevent (or substantially prevent) an electric arc or the like from occurring on the edge of the pixel electrode 210 by increasing a distance between the edge of the pixel electrode 210 and the opposite electrode 230 over the pixel electrode 210.

The pixel defining layer 127 may be formed of at least one organic insulating material selected from polyimide, polyamide, acryl resin, BCB, or a phenolic resin.

At least a portion of the intermediate layer 220 of the organic light-emitting diode OLED may be located within an opening formed by the pixel defining layer 127. The intermediate layer 220 may include the emission layer. The emission layer may include an organic material including a fluorescent or phosphorescent material that emits red, green, blue, or white light. The emission layer may include a low molecular organic material and/or a high molecular organic material, and one or more functional layers, such as a hole transport layer (HTL), a hole injection layer (HIL), an electron transport layer (ETL), and/or an electron injection layer (EIL), may be further arranged below and/or above the emission layer.

The emission layer may have a shape patterned in correspondence with each pixel electrode 210. Various modifications may be made to the emission layer. For example, a layer other than the emission layer included in the intermediate layer 220 may be integrated to cover a plurality of pixel electrodes 210.

The opposite electrode 230 may be a light-transmissive electrode or a reflective electrode. For example, the opposite electrode 230 may be a transparent or semi-transparent electrode, and may include a metal thin film having a small work function, including Li, Ca, LiF, Al, Ag, Mg, and/or a combination thereof. The opposite electrode 230 may further include a transparent conductive oxide (TCO) layer of, for example, ITO, IZO, ZnO, and/or In$_2$O$_3$, located on the metal thin film. The opposite electrode 230 may be integrated to cover the entire surface of the display area DA, and may be disposed over the intermediate layer 220 and the pixel defining layer 127.

Figure 19A:
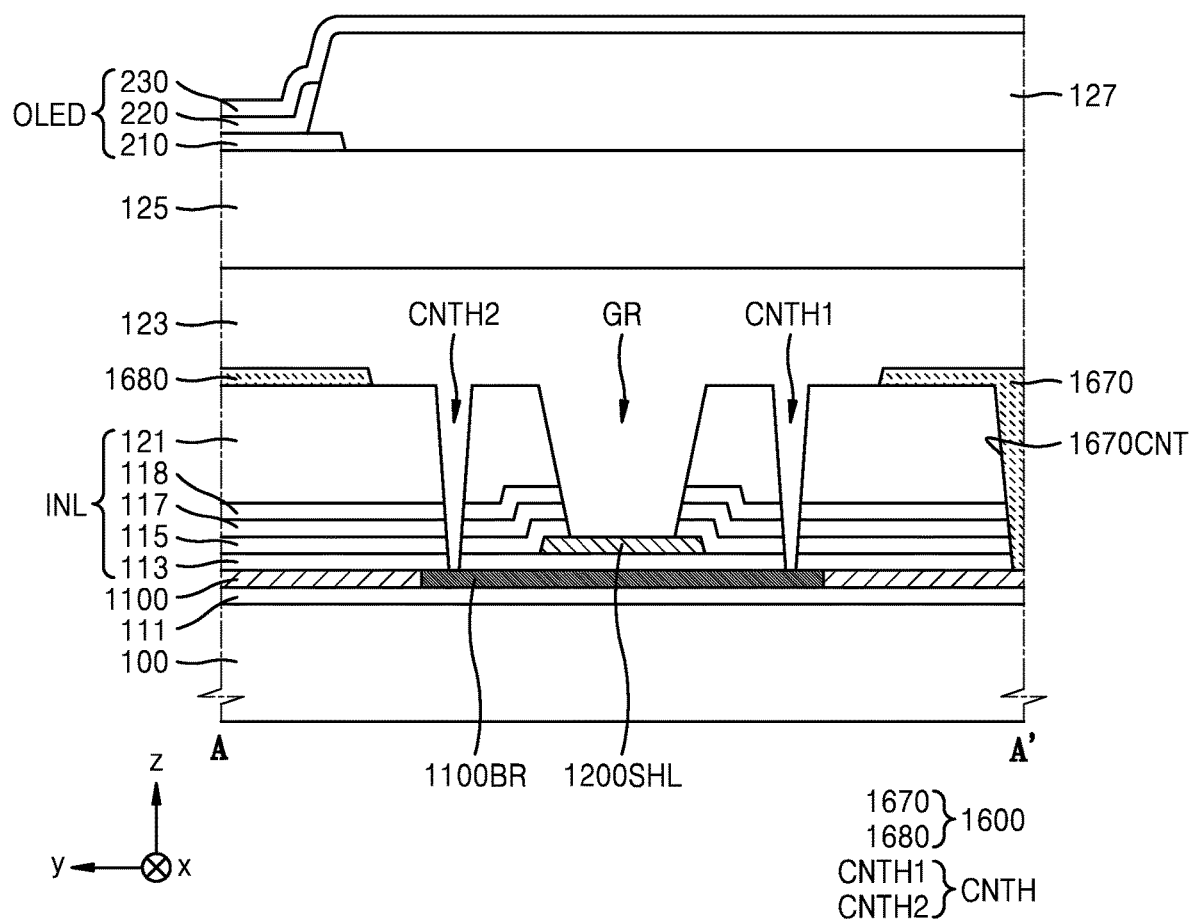
FIG. 19A is a schematic cross-sectional view taken along the line A-A' of FIG. 4, according to one or more embodiments of the present disclosure.
Figure 19B:
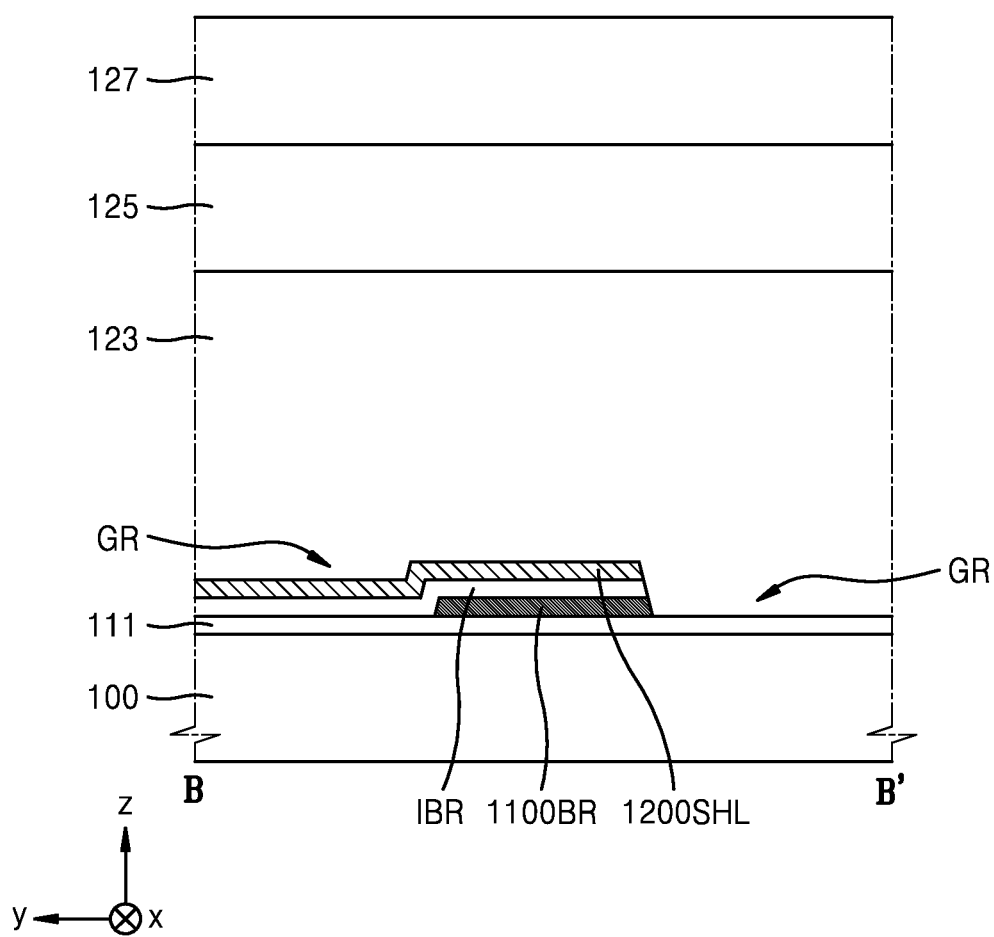
FIG. 19B is a schematic cross-sectional view taken along the line B-B' of FIG. 4, according to one or more embodiments of the present disclosure.

FIG. 19A is a schematic cross-sectional view taken along the line A-A' of FIG. 4, according to one or more embodiments of the present disclosure, and FIG. 19B is a schematic cross-sectional view taken along the line B-B' of FIG. 4, according to one or more embodiments of the present disclosure.

FIGS. 19A and 19B are similar to FIGS. 18B and 18C except that a shield layer is included. Referring to FIGS. 19A and 19B, the first shield layer 1200SHL may be disposed on the first insulating layer 113. The first shield layer 1200SHL may be arranged to overlap the groove GR and the bridge 1100BR in a view in the direction perpendicular to the upper surface of the substrate 100 (e.g., in the z-axis direction or a plan view).

The first shield layer 1200SHL may serve to protect the layers therebelow from being damaged when the groove GR is formed. For example, a portion of the first insulating layer 113 overlapping the first shield layer 1200SHL may form the insulation bridge IBR without being removed during formation of the groove GR.

According to one or more embodiments, a shield layer may be included in the second conductive layer 1300 as illustrated in FIG. 7B. For example, the second shield layer 1300SHL of FIG. 7B may be arranged to overlap the groove GR and the bridge 1100BR in a view in the direction perpendicular to the upper surface of the substrate 100 (e.g., in the z-axis direction or a plan view). Respective portions of the first insulating layer 113 and the second insulating layer 115 that overlap the second shield layer 1200SHL may form the insulation bridge IBR without being removed during formation of the groove GR.

Figure 20:
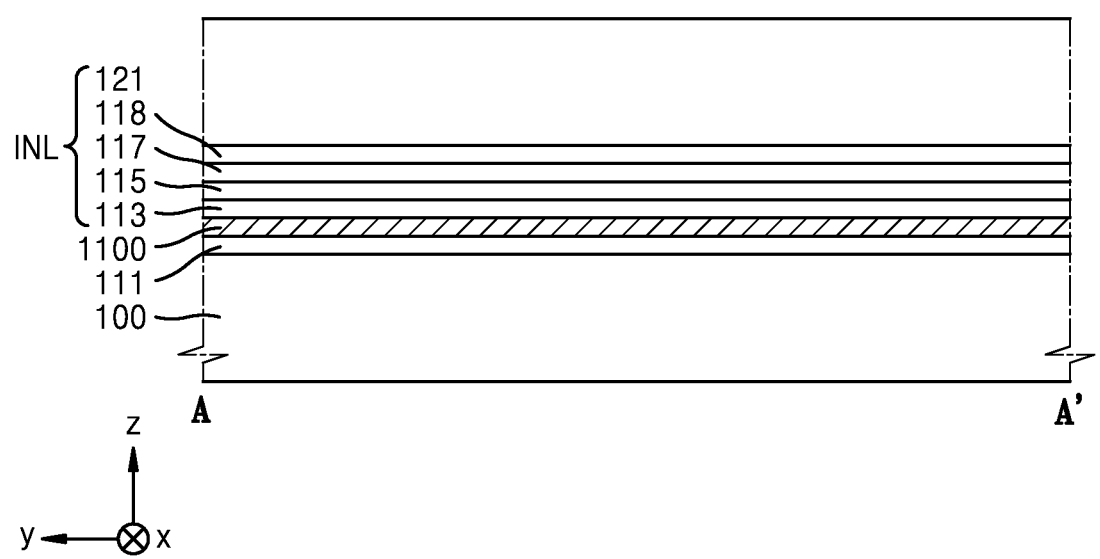
FIGS. 20, 21A, 21B and 22 are schematic cross-sectional views taken along the line A-A' of FIG. 4, illustrating a method of manufacturing a display apparatus, according to one or more embodiments of the present disclosure.
Figure 21A:
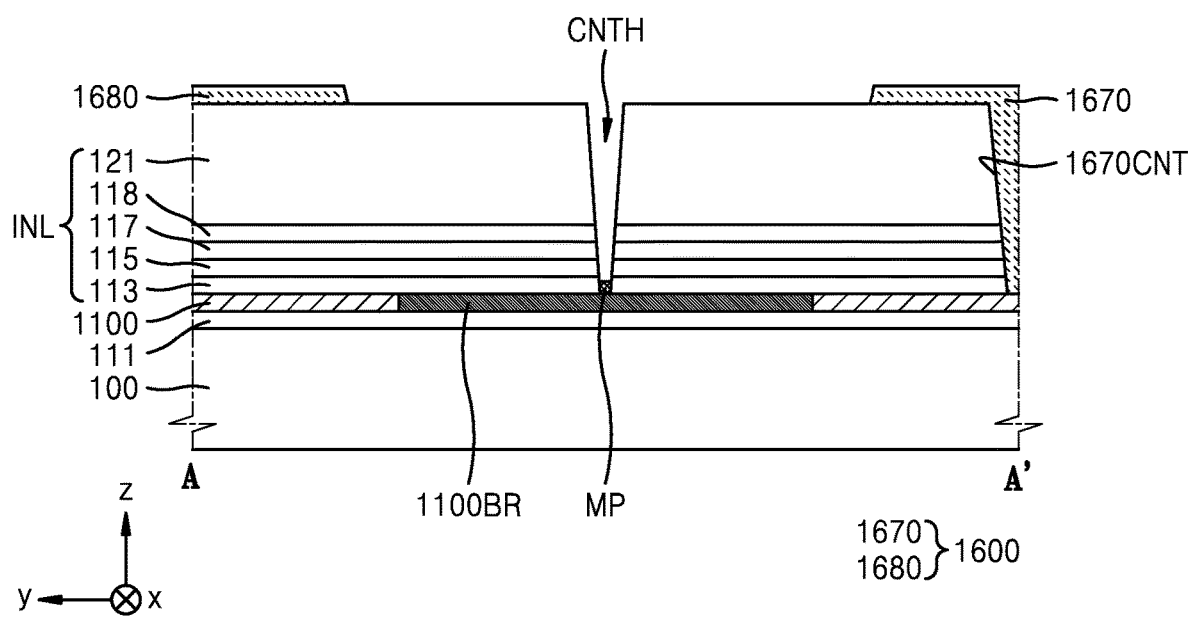
Figure 21B:
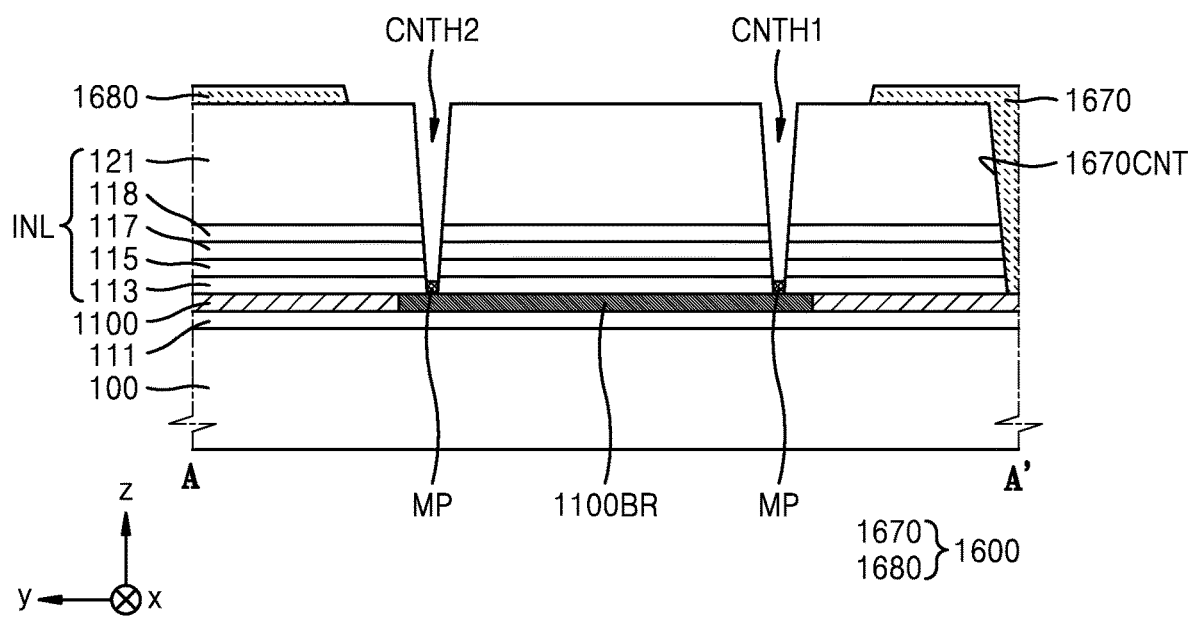
Figure 22:
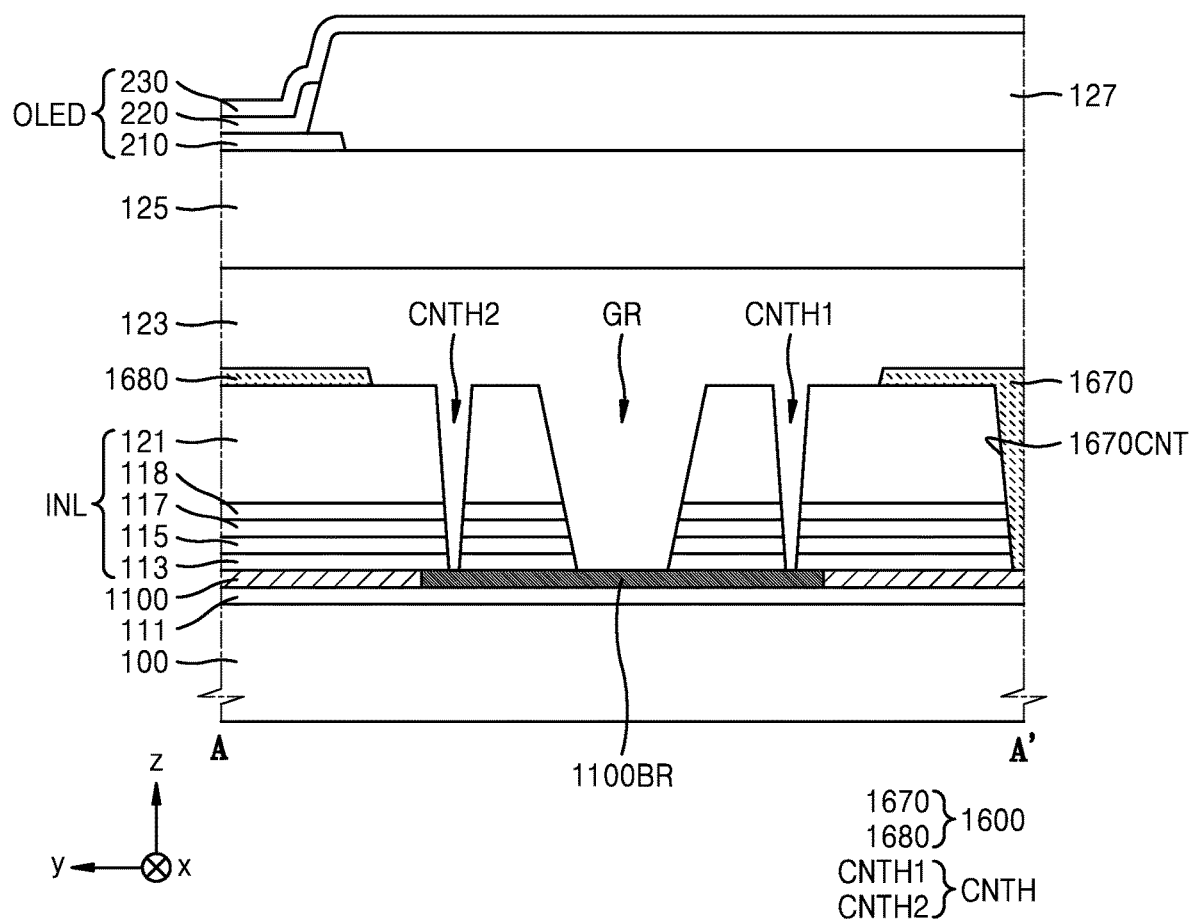

FIGS. 20 to 22 are schematic cross-sectional views illustrating a method of manufacturing a display apparatus, according to one or more embodiments of the present disclosure.

Referring to FIG. 20, the buffer layer 111, the first semiconductor layer 1100, and the inorganic insulating layers INL may be sequentially formed over the substrate 100. The inorganic insulating layers INL may include the first insulating layer 113, the second insulating layer 115, the third insulating layer 117, the fourth insulating layer 118, and the first planarization layer 121.

FIG. 20 illustrates one or more embodiments where no shield layers are formed. However, according to one or more embodiments, as illustrated in FIGS. 18A and 18B, the first shield layer 1200SHL may be formed after the first insulating layer 113 is formed and before the second insulating layer 115 is formed. According to one or more embodiments, the second shield layer 1300SHL of FIG. 7B may be formed after the second insulating layer 115 is formed and before the third insulating layer 117 is formed.

Referring to FIGS. 21A and 21B, the contact hole CNTH may be formed to expose the upper surface of the bridge 1100BR by penetrating through the inorganic insulating layers INL. According to one or more embodiments, formation of the contact hole CNTH may be achieved via the same process as a process of forming contact holes (e.g., 1620CNT, 1630CNT, 1650CNT2, and 1670CNT) allowing the fifth connection line 1670 to be electrically connected to the first semiconductor layer 1100.

According to one or more embodiments, the contact hole CNTH may be formed at the center of the bridge 1100BR as illustrated in FIG. 21A. According to one or more embodiments, as illustrated in FIG. 21B, contact holes CNTH may be formed adjacent to both ends of the bridge 1100BR. For example, a first contact hole CNTH1 may be disposed adjacent to the fifth connection line 1670 of one pixel around the groove GR, and a second contact hole CNTH2 may be disposed adjacent to the sixth connection line 1680 of another adjacent pixel around the groove GR.

After the contact hole CNTH is formed, the metal pattern MP may be formed in correspondence with the contact hole CNTH. The metal pattern MP may include at least one metal material from among aluminum (Al), titanium (Ti), nickel (Ni), copper (Cu), chromium (Cr), tungsten (W), molybdenum (Mo), or tantalum (Ta).

The metal pattern MP may be arranged to contact the upper surface of the bridge 1100BR through the contact hole CNTH. After the metal pattern MP is formed, the bridge 1100BR may be silicided through thermal treatment. According to one or more embodiments, after the bridge 1100BR is silicided, a portion of the metal pattern MP may remain on the upper surface of the bridge 1100BR.

Referring to FIG. 22, the groove GR or the opening may be formed in the inorganic insulating layers INL. According to one or more embodiments, the groove GR may be formed to expose the upper surface of the first semiconductor layer 1100 and the upper surface of the buffer layer 111. According to one or more embodiments, a portion of the buffer layer 111 overlapping the groove GR and not overlapping the first semiconductor layer 1100 may be partially or entirely removed.

Although the metal pattern MP is not illustrated in FIG. 22, at least a portion of the metal pattern MP may remain on the upper surface of the bridge 1100BR as described above.

The groove GR and the contact holes CNTH may be filled with the second planarization layer 123. The third planarization layer 125, the pixel defining layer 127, and the organic light-emitting diode OLED may be sequentially formed on the second planarization layer 123.

FIGS. 20 to 22 illustrate one or more embodiments where the metal pattern MP is included in the fourth conductive layer 1600. However, according to one or more embodiments, the metal pattern MP may be included in the first conductive layer 1200 of FIG. 6A. When the metal pattern MP is included in the first conductive layer 1200, the contact hole CNTH may be formed after formation of the first insulating layer 113. The formation of the contact hole CNTH may be achieved simultaneously with the removal of a portion of the first insulating layer 113 to form the lower metal layer.

Figure 23A:
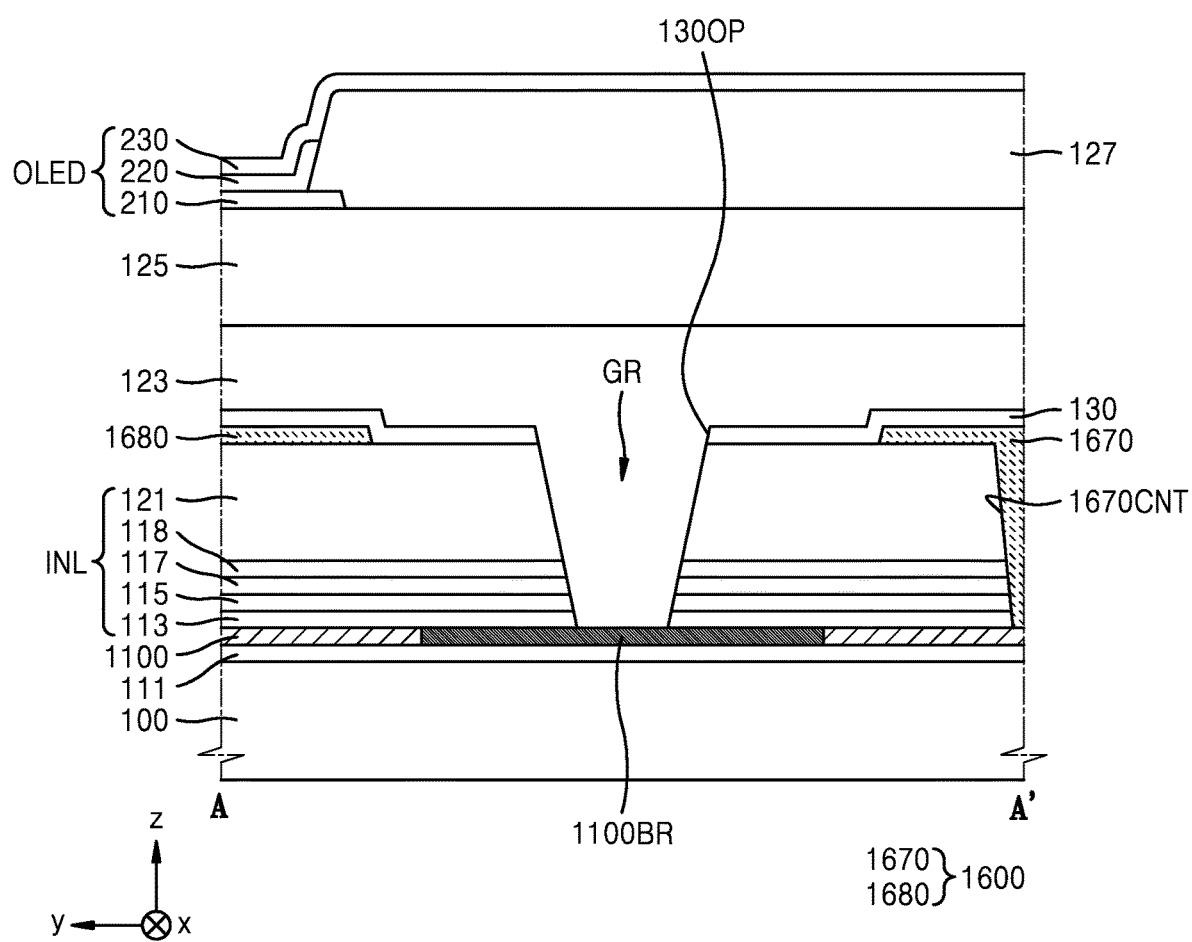
FIGS. 23A and 23B are schematic cross-sectional views taken along the line A-A' of FIG. 4, of display apparatuses according to one or more embodiments of the present disclosure.
Figure 23B:
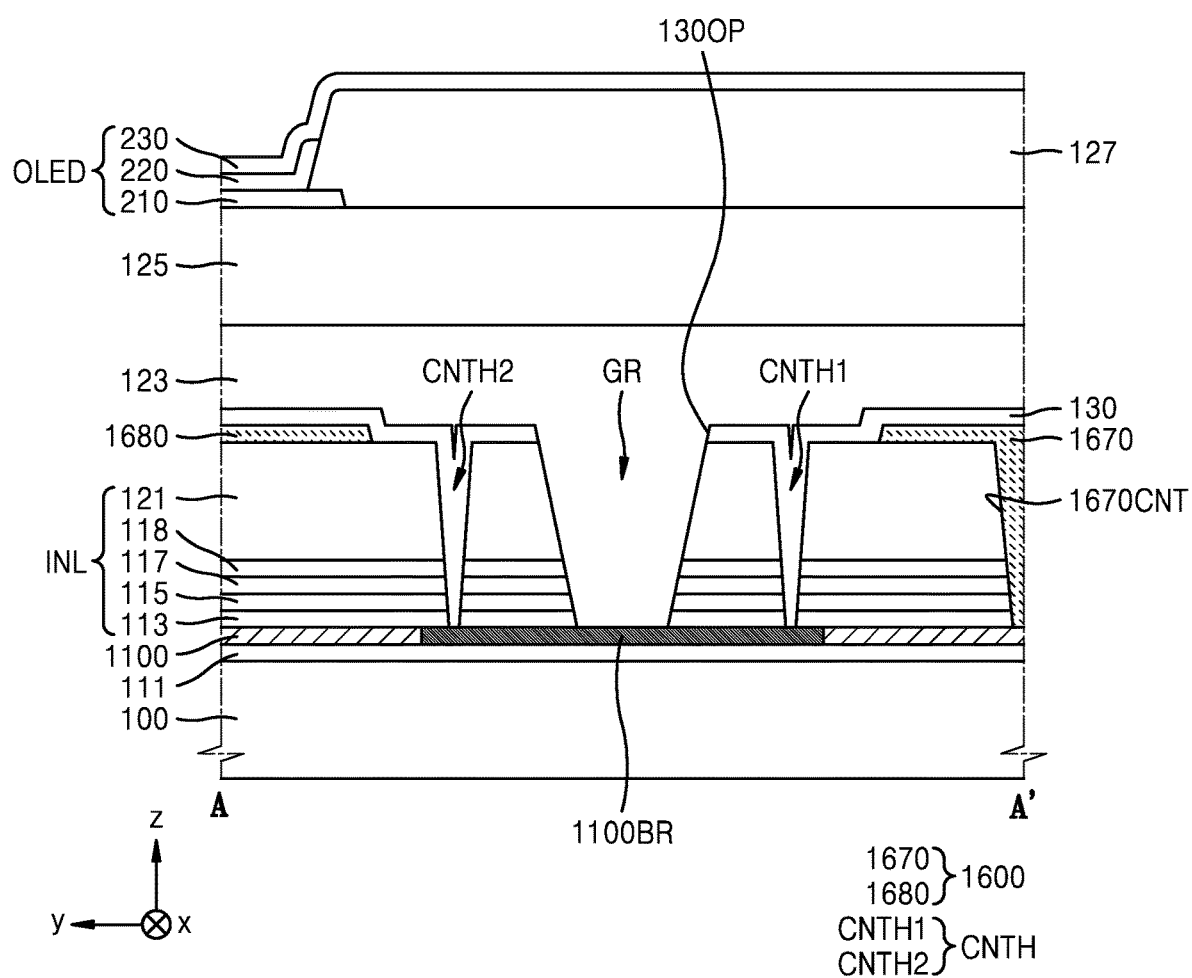

FIGS. 23A and 23B are schematic cross-sectional views of display apparatuses according to one or more embodiments of the present disclosure. FIGS. 23A and 23B schematically illustrate cross-sections taken along the line A-A of FIG. 4.

FIGS. 23A and 23B are similar to FIGS. 18A and 18B except that a passivation layer 130 covering the fourth conductive layer 1600 is further included. Hereinafter, descriptions of components shown in FIGS. 23A and 23B that are the same as or similar to those shown in FIGS. 18A and 18B will be omitted, and a description will focus on the above-described differences.

Referring to FIGS. 23A and 23B, the passivation layer 130 may be between the fourth conductive layer 1600 and the first planarization layer 121. The passivation layer 130 may be formed after formation of the fourth conductive layer 1600, and may include a third opening 1300P overlapping the groove GR. The passivation layer 130 may include silicon oxide ($SiO_x$), silicon nitride ($SiN_x$), silicon oxynitride (SiON), and/or aluminum oxynitride ($Al_2O_3$).

The passivation layer 130 may be formed to completely cover the fourth conductive layer 1600, after the formation of the fourth conductive layer 1600 including the metal pattern MP and before a heat treatment process. After the passivation layer 130 is formed, the bridge 1100BR may be silicided through thermal treatment. Accordingly, oxidation of or damage to other components of the fourth conductive layer 1600 may be prevented (or substantially prevented) due to the heat treatment for siliciding the bridge 1100BR. After the bridge 1100BR is silicided, when the groove GR or the opening is formed in the inorganic insulating layers INL, a portion of the passivation layer 130 may also be removed, and thus the third opening 1300P may be formed.

In one or more embodiments, at least a portion of the metal pattern MP may remain on the upper surface of the bridge 1100BR after thermal treatment, as described above.

According to aspects of one or more embodiments as described above, a display apparatus capable of displaying a high-resolution image while having a low defect rate due to an external impact may be realized. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a substrate comprising a first pixel area and a second pixel area adjacent to each other;
   a semiconductor layer comprising a first semiconductor layer in the first pixel area, a second semiconductor layer in the second pixel area, and a bridge connecting the first semiconductor layer to the second semiconductor layer; and
   a first insulating layer on the semiconductor layer and having a first groove or a first opening corresponding to a boundary between the first pixel area and the second pixel area,
   wherein the bridge comprises a silicide material.

2. The display apparatus of claim 1, wherein the first semiconductor layer, the second semiconductor layer, and the bridge are integrated with one another.

3. The display apparatus of claim 1, wherein the bridge passes through the first groove or the first opening.

4. The display apparatus of claim 1, wherein the first insulating layer has a first contact hole exposing a partial area of the bridge in a direction toward the first semiconductor layer, and a second contact hole exposing a partial area of the bridge in a direction toward the second semiconductor layer.

5. The display apparatus of claim 4, further comprising:
   a second insulating layer covering the semiconductor layer; and
   a conductive layer on the second insulating layer and comprising a shield layer overlapping the bridge when viewed in a direction perpendicular to the substrate.

6. The display apparatus of claim 5, wherein the second insulating layer comprises: a second groove or a second opening overlapping the first groove or the first opening when viewed in the direction perpendicular to the substrate; a third contact hole overlapping the first contact hole; a fourth contact hole overlapping the second contact hole; and comprises an insulation bridge overlapping the shield layer.

7. The display apparatus of claim 5, wherein the conductive layer comprises driving gate electrodes in the first pixel area and the second pixel area.

8. The display apparatus of claim 5, wherein the conductive layer comprises compensation gate electrodes in the first pixel area and the second pixel area.

9. The display apparatus of claim 5, wherein a width of the shield layer in a direction perpendicular to an imaginary line connecting a center of the first pixel area to a center of the second pixel area is greater than a width of the bridge in the direction perpendicular to the imaginary line.

10. The display apparatus of claim 1, further comprising a metal pattern in contact with an upper surface of the bridge.

11. The display apparatus of claim 10, further comprising a passivation layer on the metal pattern and having a third opening overlapping the first groove or the first opening.

12. The display apparatus of claim 1, wherein the silicide material comprises at least one element from among aluminum (Al), titanium (Ti), nickel (Ni), copper (Cu), chromium (Cr), tungsten (W), molybdenum (Mo), or tantalum (Ta).

13. The display apparatus of claim 1, wherein the bridge comprises a first bridge and a second bridge, and the first bridge and the second bridge are parallel to each other.

14. The display apparatus of claim 1, wherein
the bridge comprises a first bridge and a second bridge, and
the first bridge extends in a direction parallel to an imaginary line connecting a center of the first pixel area to a center of the second pixel area, and the second bridge extends in a direction perpendicular to the imaginary line.

15. The display apparatus of claim 1, wherein the bridge comprises a plurality of through holes.

16. A method of manufacturing a display apparatus, the method comprising:
forming a semiconductor layer on a substrate, the semiconductor layer comprising a first semiconductor layer in a first pixel area, a second semiconductor layer in a second pixel area, and a bridge connecting the first semiconductor layer to the second semiconductor layer;
forming a first insulating layer on the semiconductor layer;
forming a contact hole exposing a partial area of the bridge at the first insulating layer;
forming a metal pattern in correspondence with the contact hole;
siliciding the bridge; and
forming a first groove or a first opening corresponding to a boundary between the first pixel area and the second pixel area, at the first insulating layer.

17. The method of claim 16, wherein, in the forming of the contact hole, the contact hole is formed on a center of the bridge.

18. The method of claim 16, wherein, in the forming of the contact hole, the contact hole comprises a first contact hole and a second contact hole, wherein the first contact hole is formed to expose a partial area of the bridge in a direction toward the first semiconductor layer, and the second contact hole is formed to expose a partial area of the bridge in a direction toward the second semiconductor layer.

19. The method of claim 16, further comprising:
forming a second insulating layer on the semiconductor layer after the forming of the semiconductor layer and before the forming of the first insulating layer; and
forming a conductive layer on the second insulating layer, the conductive layer comprising a shield layer overlapping the bridge when viewed in a direction perpendicular to the substrate.

20. The method of claim 16, further comprising forming a passivation layer on the metal pattern, between the forming of the metal pattern and the siliciding of the bridge, wherein, in the forming of the first groove or the first opening, a third opening overlapping the first groove or the first opening is formed at the passivation layer.

* * * * *